(12) United States Patent
Hirler et al.

(10) Patent No.: US 8,334,564 B2
(45) Date of Patent: Dec. 18, 2012

(54) FIELD PLATE TRENCH TRANSISTOR AND METHOD FOR PRODUCING IT

(75) Inventors: Franz Hirler, Isen (DE); Walter Rieger, Arnoldstein (AT); Thorsten Meyer, Munich (DE); Wolfgang Klein, Zorneding (DE); Frank Pfirsch, Munich (DE)

(73) Assignee: Infineon Technologies Austria AG, Villach (AT)

( * ) Notice: Subject to any disclaimer, the term of this patent is extended or adjusted under 35 U.S.C. 154(b) by 19 days.

(21) Appl. No.: 12/984,253

(22) Filed: Jan. 4, 2011

(65) Prior Publication Data

US 2011/0095362 A1    Apr. 28, 2011

Related U.S. Application Data

(60) Division of application No. 12/349,952, filed on Jan. 7, 2009, now Pat. No. 7,893,486, and a continuation of application No. 11/469,011, filed on Aug. 31, 2006, now abandoned.

(30) Foreign Application Priority Data

Aug. 31, 2005 (DE) .................. 10 2005 041 358

(51) Int. Cl.
*H01L 29/78* (2006.01)
(52) U.S. Cl. .. 257/328; 257/329; 257/330; 257/E29.183
(58) Field of Classification Search .......... 257/330–332, 257/E29.183
See application file for complete search history.

(56) References Cited

U.S. PATENT DOCUMENTS

| | | | |
|---|---|---|---|
| 5,079,608 A | 1/1992 | Wodarczyk et al. | |
| 6,677,641 B2 | 1/2004 | Kocon | |
| 7,465,987 B2 | 12/2008 | Krumrey et al. | |
| 7,767,524 B2 * | 8/2010 | Yilmaz et al. | 438/259 |
| 7,772,668 B2 * | 8/2010 | Pan | 257/492 |
| 2003/0178676 A1 * | 9/2003 | Henninger et al. | 257/340 |
| 2004/0031987 A1 * | 2/2004 | Henninger et al. | 257/328 |
| 2004/0084721 A1 | 5/2004 | Kocon et al. | |
| 2005/0082591 A1 | 4/2005 | Hirler et al. | |

FOREIGN PATENT DOCUMENTS

DE    10014660 C2    8/2002

OTHER PUBLICATIONS

Office Action mailed Jan. 12, 2010 for U.S. Appl. No. 12/349,952.
Office Action mailed Jun. 23, 2008 for U.S. Appl. No. 11/469,011.

* cited by examiner

*Primary Examiner* — Eugene Lee
(74) *Attorney, Agent, or Firm* — Dicke, Billig & Czaja, PLLC

(57) ABSTRACT

A field plate trench transistor having a semiconductor body. In one embodiment the semiconductor has a trench structure and an electrode structure embedded in the trench structure. The electrode structure being electrically insulated from the semiconductor body by an insulation structure and having a gate electrode structure and a field electrode structure. The field plate trench transistor has a voltage divider configured such that the field electrode structure is set to a potential lying between source and drain potentials.

7 Claims, 32 Drawing Sheets

FIG 1 Prior art with field plate externally fixedly contact-connected at source potential A: After anisotropic etching-back of oxide A: After wet-chemical removal of FP & oxidation of gate oxide B: After removal & deposition of nitride, anisotropic etching-back, n-type poly deposition and etching back, p-type coating, salicide B: After oxidation of gate oxide, deposition & etching-back of gate poly, deposition & etching-back of intermediate oxide

FIELD PLATE TRENCH TRANSISTOR AND METHOD FOR PRODUCING IT

CROSS-REFERENCE TO RELATED APPLICATIONS

This Utility Patent Application is a divisional application of U.S. application Ser. No. 12/349,952, filed Jan. 7, 2009, and a continuation of U.S. patent application Ser. No. 11/469,011, filed Aug. 31, 2006, which claims priority to German Patent Application No. DE 10 2005 041 358.7 filed on Aug. 31, 2005, all of which are incorporated herein by reference.

BACKGROUND

The invention relates to a field plate trench transistor and a method for producing it.

FIG. 1 illustrates an extract from a conventional field plate trench transistor to which the invention relates, particularly in cross-sectional illustration:

A field plate trench transistor (also referred to hereinafter as a trench transistor) 1 has a semiconductor body 2, in which the trench structure 3 and an electrode structure 4 embedded in the trench structure are provided. A cell array region (illustrated in the Figure) and an edge region (not illustrated in the Figure) are provided within the semiconductor body 2. That part of the semiconductor body 2 which is situated between the trenches of the trench structure 3 is also referred to as a "mesa structure". The electrode structure 4 is electrically insulated from the semiconductor body 2 by means of an insulation structure 5 and has a gate electrode structure 6 and a field electrode structure 7 arranged below the gate electrode structure and electrically insulated from the latter. The semiconductor body 2 is subdivided into a body region 8, a drift region 9 and a drain region 10. Source regions 11 are formed in the body region 8. The body region 8 is electrically short-circuited with the source regions 11 via a source metallization 12. The drain region 10 is contact-connected by a drain metallization 13. The potential of the gate electrode structure 6 is at gate potential and the potential of the field electrode structure 7 is at source potential. The gate electrode structure 6 is electrically insulated from the source metallization 12 by means of an insulation structure 14.

What is disadvantageous about the trench transistor 1 described above is that in the off-state case, that region of the insulation structure 5 which is situated in the bottom of the trench structure 3 has to withstand virtually the full reverse voltage, which means that the thickness of the insulation structure 5 is not permitted to fall below a specific minimum value. This in turn has the consequence that limits are imposed on the degree of miniaturization of the trench structure 3 with performance parameters remaining the same.

In order to solve this problem, it is known to set the potential of the field electrode structure 7 in the off-state case to a potential lying between source potential and drain potential.

For these and other reasons, there is a need for the present invention.

SUMMARY

The present invention provides a field plate trench transistor having a semiconductor body. In one embodiment, the semiconductor has a trench structure and an electrode structure embedded in the trench structure. The electrode structure being electrically insulated from the semiconductor body by an insulation structure and having a gate electrode structure and a field electrode structure. The field plate trench transistor has a voltage divider configured such that the field electrode structure is set to a potential lying between source and drain potentials.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
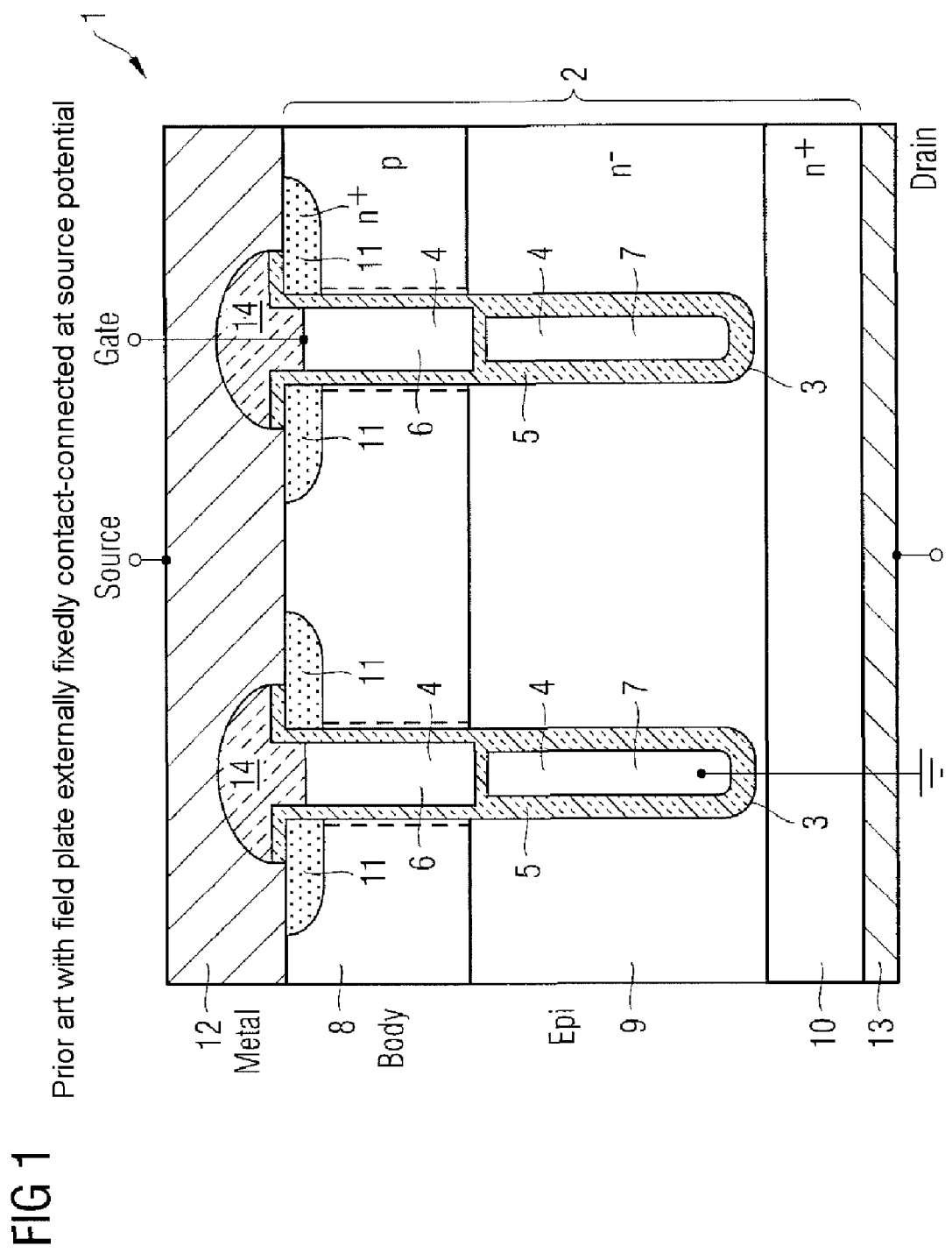
FIG. 1 illustrates an extract from a conventional field plate trench transistor in cross-sectional illustration.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a field plate trench transistor with which the potential to which the field electrode structure is to be set can be generated as simply as possible.

In one embodiment, the field plate trench transistor according to the invention has a semiconductor body, in which:
a trench structure and
an electrode structure embedded in the trench structure are provided, the electrode structure being electrically insulated from the semiconductor body by an insulation structure and having a gate electrode structure and a field electrode structure arranged below and/or alongside the gate electrode structure and electrically insulated from the latter.

A voltage divider provided in and/or on the semiconductor body is electrically connected to the field electrode structure or integrated into the latter in such a way that the field electrode structure is set to a potential lying between source and drain potentials and/or between gate and drain potentials.

The term "electrode structure" is to be understood to mean, in particular, all electrodes provided within the trench structure. The term "gate electrode structure" is to be understood to mean, in particular, all parts of the electrode structure which function as gate. The term "field electrode structure" is to be understood to mean, in particular, all parts of the electrode structure which function as field electrode.

In one embodiment of the invention, the field electrode structure is divided into a plurality of field electrode regions arranged vertically one above another and the voltage divider is divided into a plurality of voltage divider regions, each voltage divider region being electrically connected to a field electrode region or integrated into the latter, so that at least two different field electrode regions are at different potentials. For this purpose, the field electrode regions within the trench structure are electrically insulated from one another.

The voltage divider may be realized as a series circuit having at least one resistor (or a MOS transistor or a capacitance in each case functioning as a resistor) and at least one diode which is forward-biased with respect to the drain potential or as a series circuit having a plurality of diodes which are forward-biased with respect to the source potential, which are connected between source and drain potentials.

In one embodiment, at least one diode is a zener diode.

The different field electrode regions may be electrically insulated from one another, for example, and the voltage divider may be provided outside the field electrode structure.

In another embodiment, the different field electrode regions are electrically connected to one another, and the voltage divider is provided within the field electrode structure. In this case, pn diodes are preferably provided between the field electrode regions, in such a way that the pn diodes are interlinked with one another via the field electrode regions to form a vertically running diode series circuit. In this case, the upper end of the diode series circuit may directly adjoin a source metallization layer of the transistor, and the lower end of the diode series circuit directly adjoins a drift zone provided within the semiconductor body.

In one embodiment, the voltage divider has at least one substrate diode which is connected between source and drain potentials and is forward-biased with respect to the drain potential, the substrate diode being formed by the pn junction between a semiconductor zone of a first conduction type provided in the semiconductor body, in particular within the mesa structure, and the part of the semiconductor body of a second conduction type lying below the semiconductor zone, the semiconductor zone of the first conduction type being produced together with the body zones of the trench transistor in one process.

That end of the substrate diode which faces the source potential is connected to a voltage limiting element connected between substrate diode and source potential, which voltage limiting element prevents the potential of the field electrode structure from exceeding a potential maximum value and/or falling below a potential minimum value in the switched-on state (on state). In this case, the voltage limiting element may be at least partly realized in the form of one or a plurality of series-connected diodes which are forward-biased with respect to the drain potential and are formed within the cell array region or the edge region of the semiconductor body or within the trench structure. The voltage limiting element may be at least partly formed in the form of a MOS transistor, the body zone of which corresponds to the semiconductor zone of the first conduction type of the substrate diode. Moreover, the voltage limiting element may be at least partly formed in the form of one or a plurality of capacitive elements provided within the semiconductor body.

Furthermore, that end of the substrate diode which faces the source potential is connected to a pull-down element connected between substrate diode and source potential or gate potential, which pull-down element prevents the potential of the field electrode structure from drifting, in the off state of the transistor, to drain potential as a result of leakage currents occurring within the substrate diode.

In this case, the pull-down element may be at least partly realized in the form of a resistance element provided within the mesa structure, the gate electrode structure, the field electrode structure or within a conductive element provided above the semiconductor body and electrically insulated from the latter. The pull-down element may be at least partly realized in the form of a transistor formed within the semiconductor body, in particular within the mesa structure. The pull-down element may be at least partly formed in the form of at least one capacitive element provided within the semiconductor body.

The substrate diode has a reduced breakdown voltage compared with the transistor elements provided within the cell array of the transistor.

The invention furthermore provides a method for producing the field plate trench transistor according to the invention, proceeding from a semiconductor body in which:
  a trench structure and
  an insulation structure lining the trench structure are provided, the remaining free space within the trench structure extending downward toward the semiconductor body,
  having the following process of:
  filling the free space by alternately depositing n- and p-doped semiconducting material and metal-containing material.

In another embodiment, the filling may be effected by repeatedly performing the following: depositing semiconducting material (completely filling the free space), etching back the deposited semiconducting material into the free space, carrying out a coating process with regard to the semiconducting material that has remained in the free space, and producing a silicide layer on the semiconducting material.

In one embodiment, that part of the insulation structure which is formed in the upper region of the trench structure is partly etched back into the trench structure, and the gate electrode structure is introduced into the resulting cutout.

In the Figures, identical or mutually corresponding regions, components and component groups are identified by the same reference numerals. Furthermore, the conduction types of all the embodiments may be configured inversely, that is to say that n-type zones may be replaced by p-type zones, and vice versa.

Figure 2:
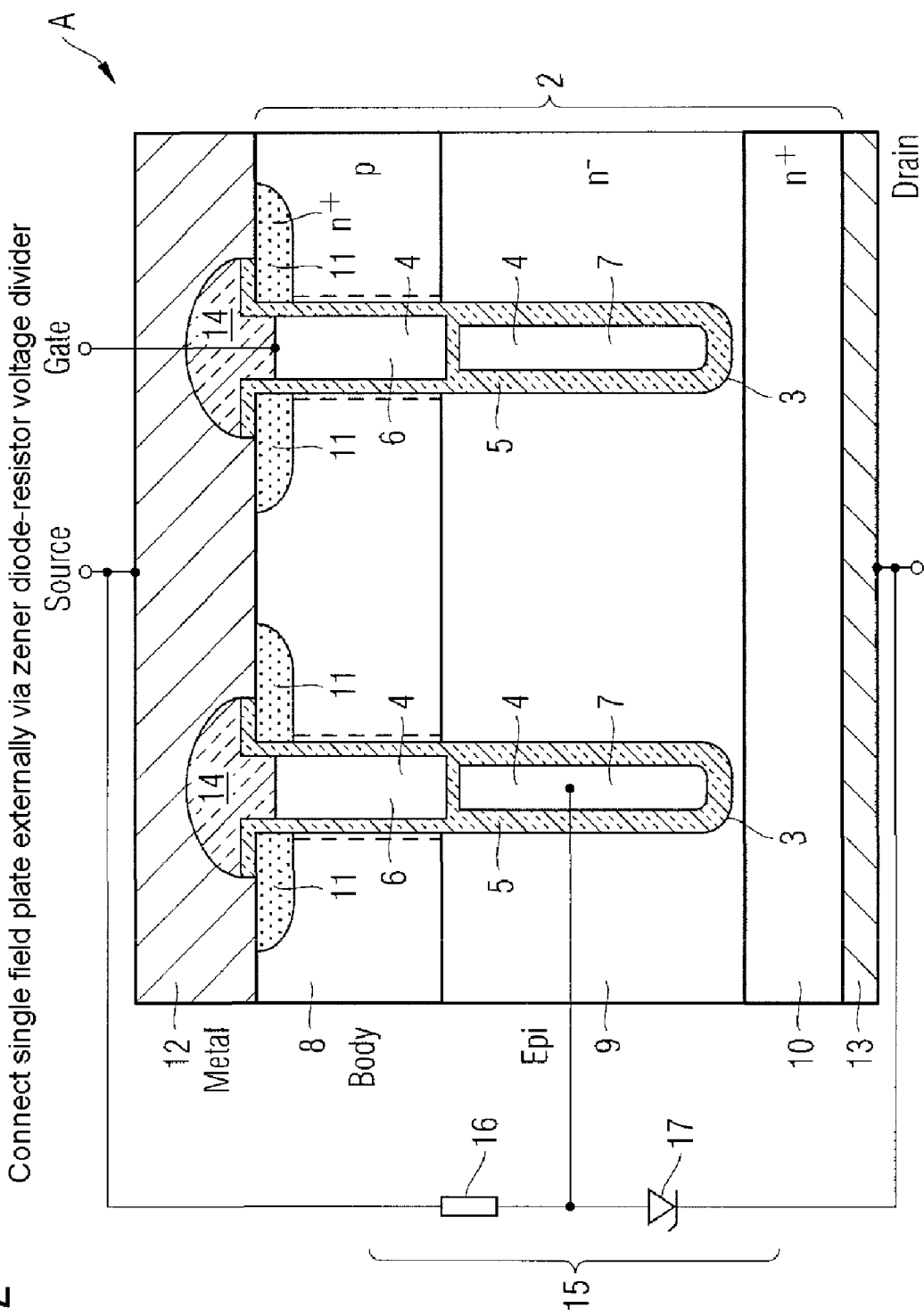
FIG. 2 illustrates an extract from a first embodiment of the field plate trench transistor according to the invention in cross-sectional illustration.

FIG. 2 illustrates a first embodiment A of the field plate trench transistor according to the invention.

A field plate trench transistor (also referred to hereinafter as a trench transistor) 1 has a semiconductor body 2, in which a trench structure 3 and an electrode structure 4 embedded in the trench structure are provided. The electrode structure 4 is electrically insulated from the semiconductor body 2 by means of an insulation structure 5 and has a gate electrode structure 6 and a field electrode structure 7 arranged below the gate electrode structure and electrically insulated from the latter. The semiconductor body 2 is subdivided into a body region 8, a drift region 9 and a drain region 10. Source regions 11 are formed in the body region 8. The body region 8 is electrically short-circuited with the source regions 11 via a source metallization 12. The drain region 10 is contact-connected by a drain metallization 13. The potential of the gate electrode structure 6 is at gate potential and the potential of the field electrode structure 7 is at source potential. The gate electrode structure 6 is electrically insulated from the source metallization 12 by means of an insulation structure 14.

According to one embodiment of the invention, a voltage divider 15 is provided in and/or on the semiconductor body 2, the voltage divider being electrically connected to the field electrode structure 7. By means of the voltage divider 15, the field electrode structure 7 is set to a potential lying between source and drain potentials. In this embodiment, the voltage divider 15 includes a series circuit having a resistor 16 and a diode 17 which is forward-biased with respect to the source potential (source terminal). The diode 17 is a zener diode in this embodiment.

Figure 3:
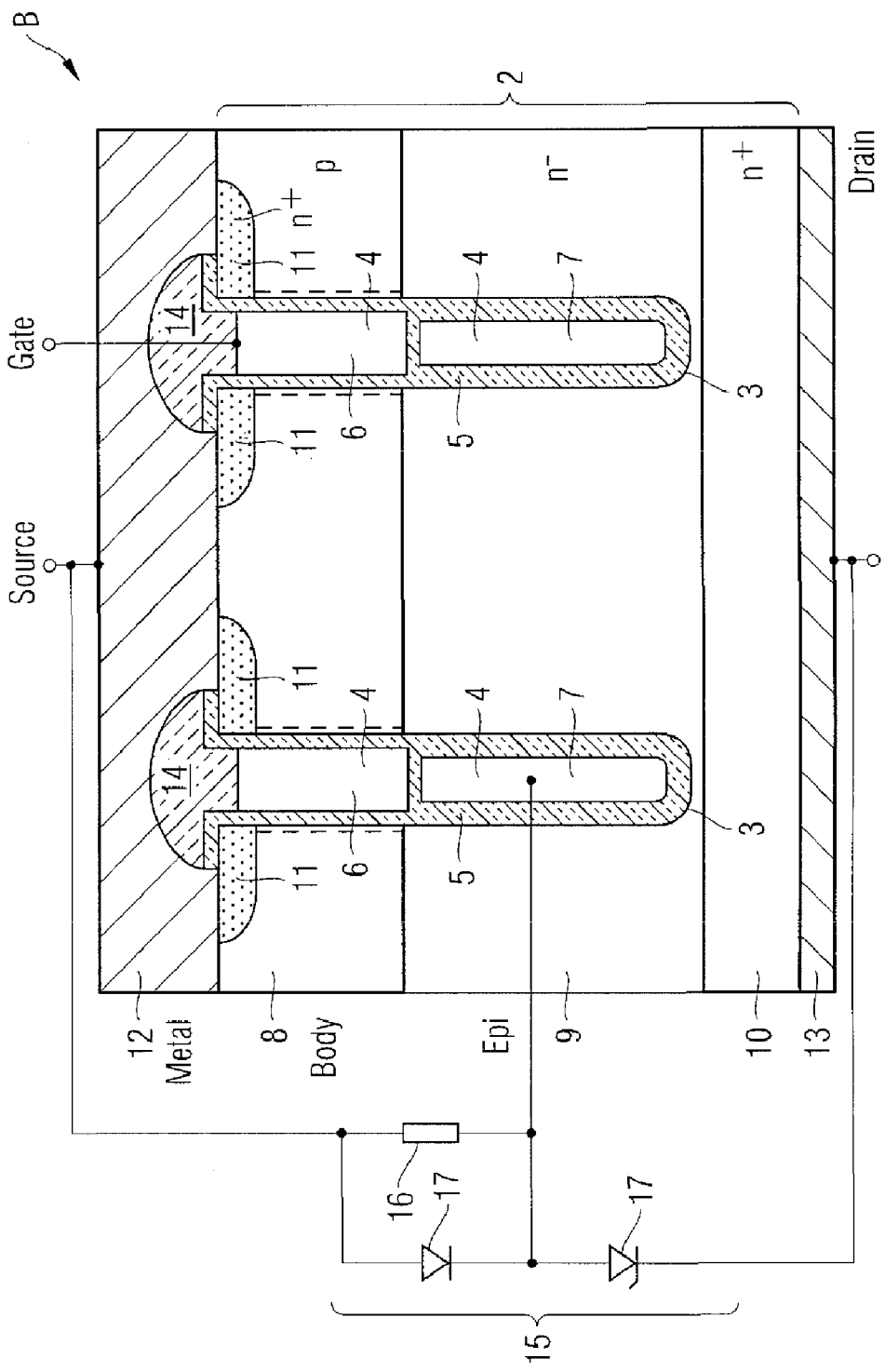
FIG. 3 illustrates an extract from a second embodiment of the field plate trench transistor according to the invention in cross-sectional illustration.

FIG. 3 illustrates a second embodiment B of the field plate trench transistor according to the invention. The embodiment B differs from the embodiment A by the fact that the voltage divider 15 is realized as a series circuit having two diodes 17 which are in each case forward-biased with respect to the source potential and are connected between source and drain potentials. Furthermore, a resistor 16 is connected in parallel with the diode 17 facing the source metallization 12, the resistor serving for optimizing the switching properties of the field plate trench transistor. The resistor 16 may be omitted.

Figure 4:
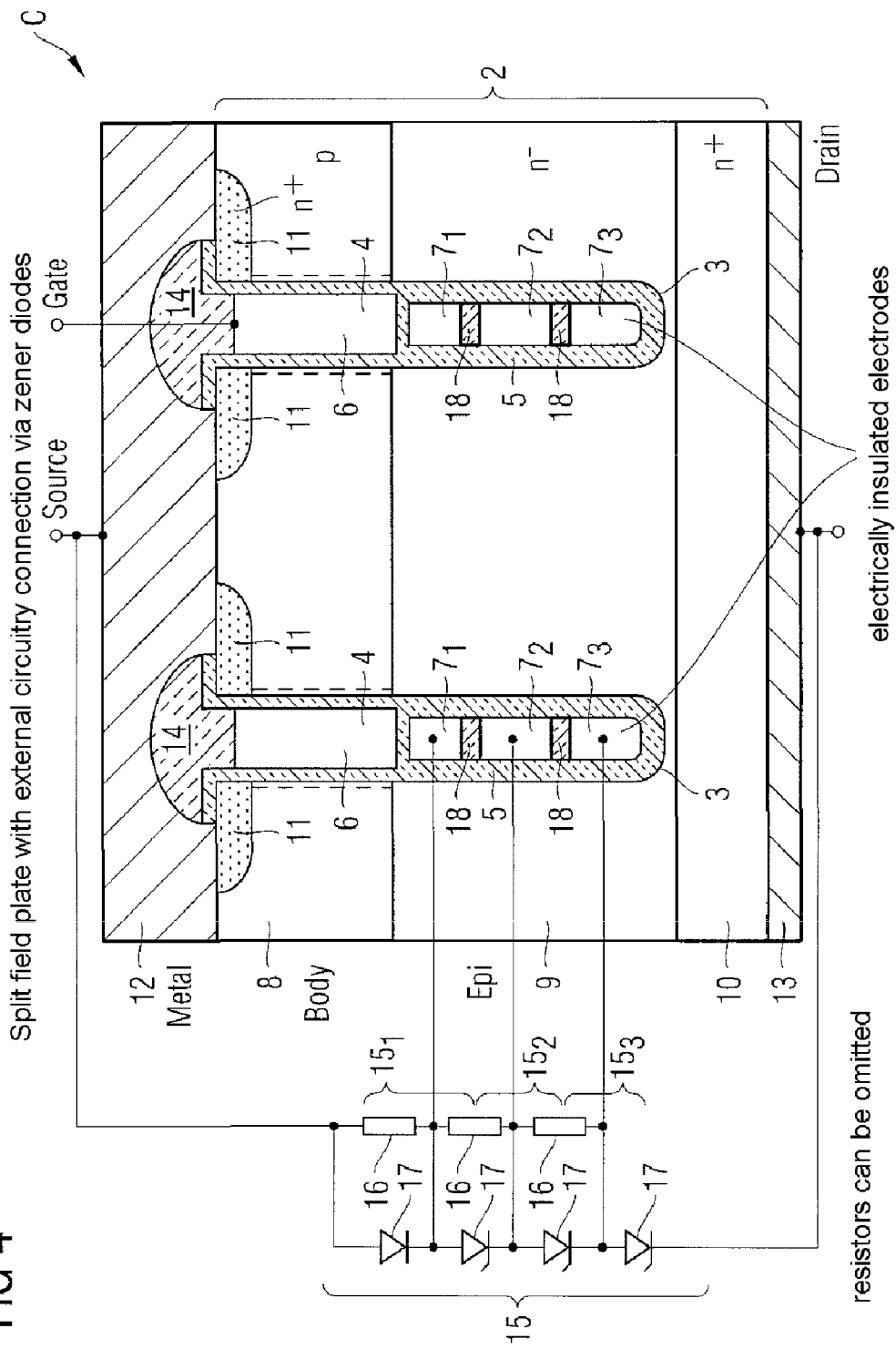
FIG. 4 illustrates an extract from a third embodiment of the field plate trench transistor according to the invention in cross-sectional illustration.

In the embodiments A and B, a potential value lying between source potential and drain potential is in each case generated by means of the voltage divider 15. In the third embodiment C of the field plate trench transistor according to the invention as illustrated in FIG. 4, three different potential values lying between source potential and drain potential are generated by means of the voltage divider 15, which is divided into three voltage divider regions $15_1$ to $15_3$. Furthermore, the field electrode structure 7 is divided into a plurality of field electrode regions $7_1$ to $7_3$ arranged vertically one above another. The field electrode regions $7_1$ to $7_3$ are electrically insulated from one another within the trench structure 3 by means of corresponding insulations 18. Each field electrode region $7_1$ to $7_3$ is electrically connected to a dedicated voltage divider region $15_1$ to $15_3$, so that the field electrode regions $7_1$ to $7_3$ are at different potential values.

The voltage divider 15 illustrated in the embodiments A to C may be provided within the cell array of the field plate trench transistor or may be provided outside the cell array in or on the semiconductor body. The resistors 16 may be omitted in the embodiment C since they only serve for optimizing the switching properties of the field plate trench transistor.

Figure 5:
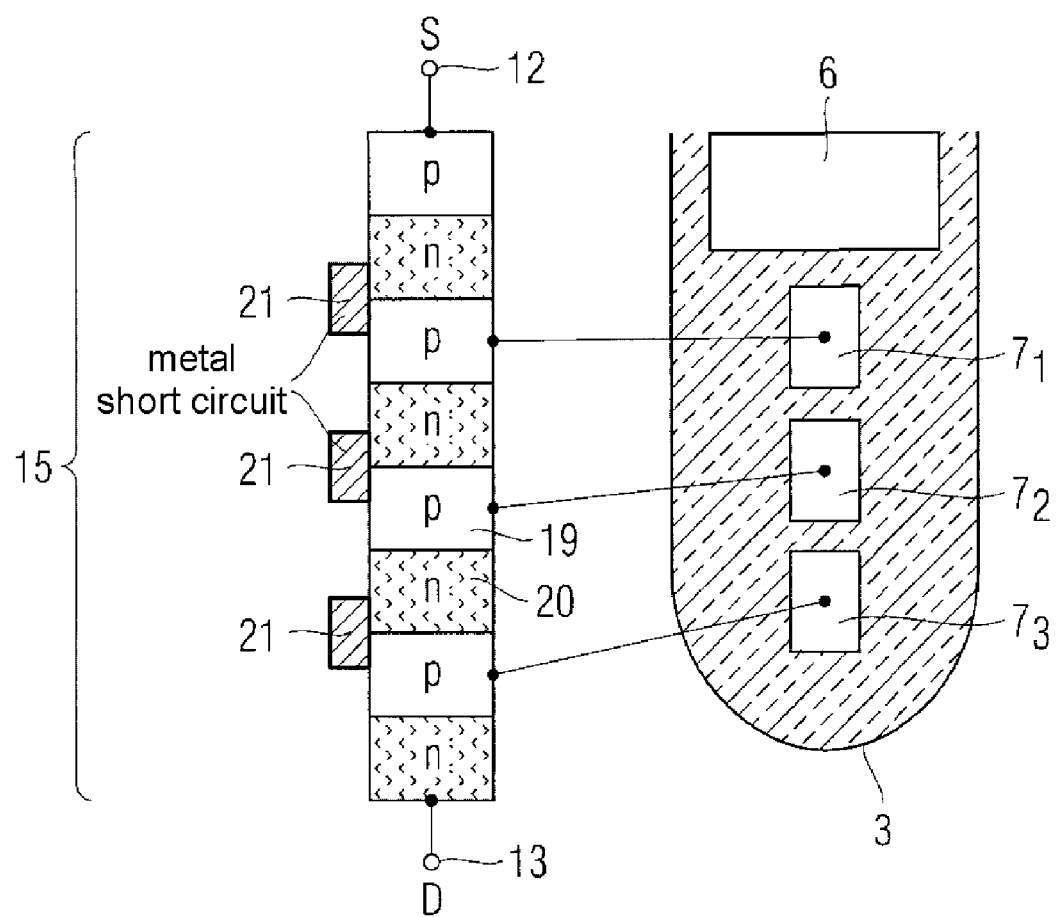
FIG. 5 illustrates an extract from a possible realization of the embodiment illustrated in FIG. 4, in cross-sectional illustration.

As is illustrated in FIG. 5, the series circuit including the diodes 17 may be realized for example in the form of an interlinking of p-type zones and n-type zones which are formed within the semiconductor body, for example each p-doped zone 19 being electrically connected to one of the field electrode regions $7_1$ to $7_3$. In this case, the topmost p-type zone 19 is electrically connected to the source metallization 12, and the bottommost n-type zone 20 is electrically connected to the drain metallization 13. The n-doped zones 20 are in part short-circuited with the p-doped zones 19 by metal elements 21 or otherwise highly conductive materials. The sequence of p-type zones and n-type zones alternating with one another forms a series circuit of diodes, for example, zener diodes.

Figure 6:
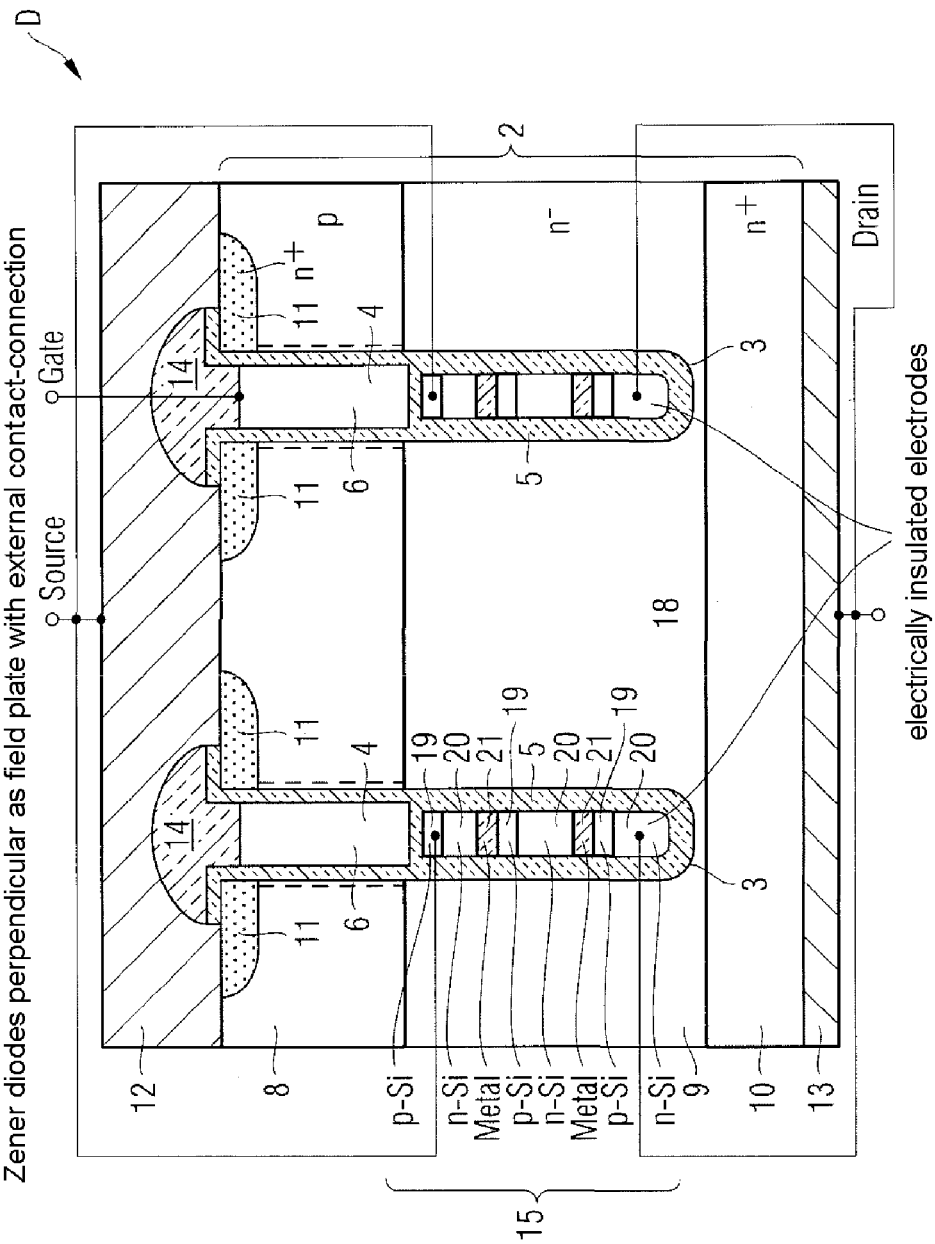
FIG. 6 illustrates an extract from a fourth embodiment of the field plate trench transistor according to the invention in cross-sectional illustration.

FIG. 6 illustrates a fourth embodiment D, in which the voltage divider 15 in the form of a diode series circuit is integrated directly into the field electrode structure 7. In this embodiment, n-type zones, p-type zones and metal zones alternate with one another in this order. The topmost p-type zone 19 is electrically connected to the source metallization 12, and the bottommost n-type zone 20 is electrically connected to the drain metallization 13. By means of the diode series circuit provided within the field electrode structure 7, a continuously increasing or decreasing potential profile is generated within the field electrode structure 7. In this embodiment, the field electrode structure is completely electrically insulated from the semiconductor body 2 apart from corresponding electrical connections.

Figure 7:
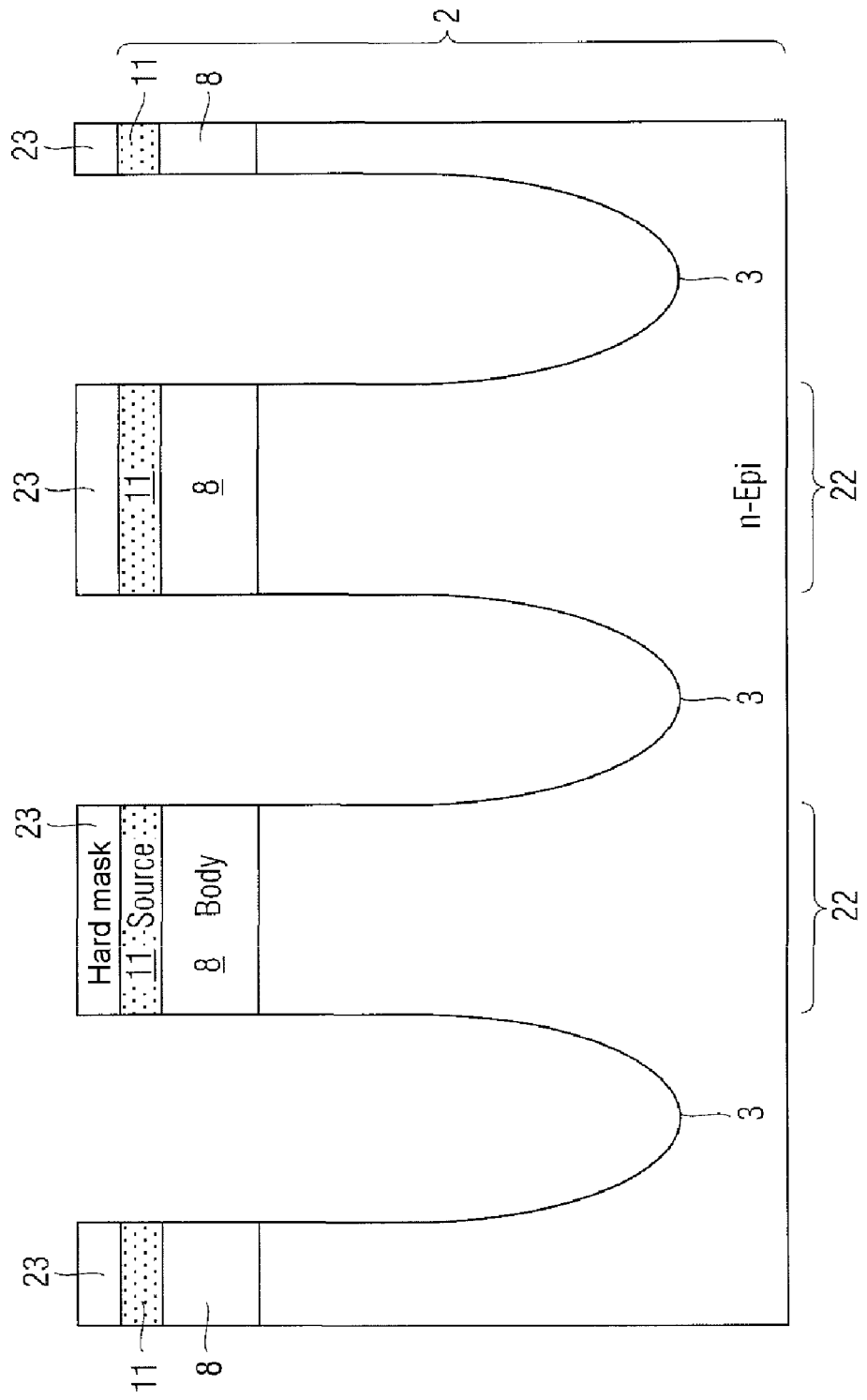
FIG. 7 illustrates a first process of a first embodiment of the production method according to the invention in cross-sectional illustration.
Figure 8:
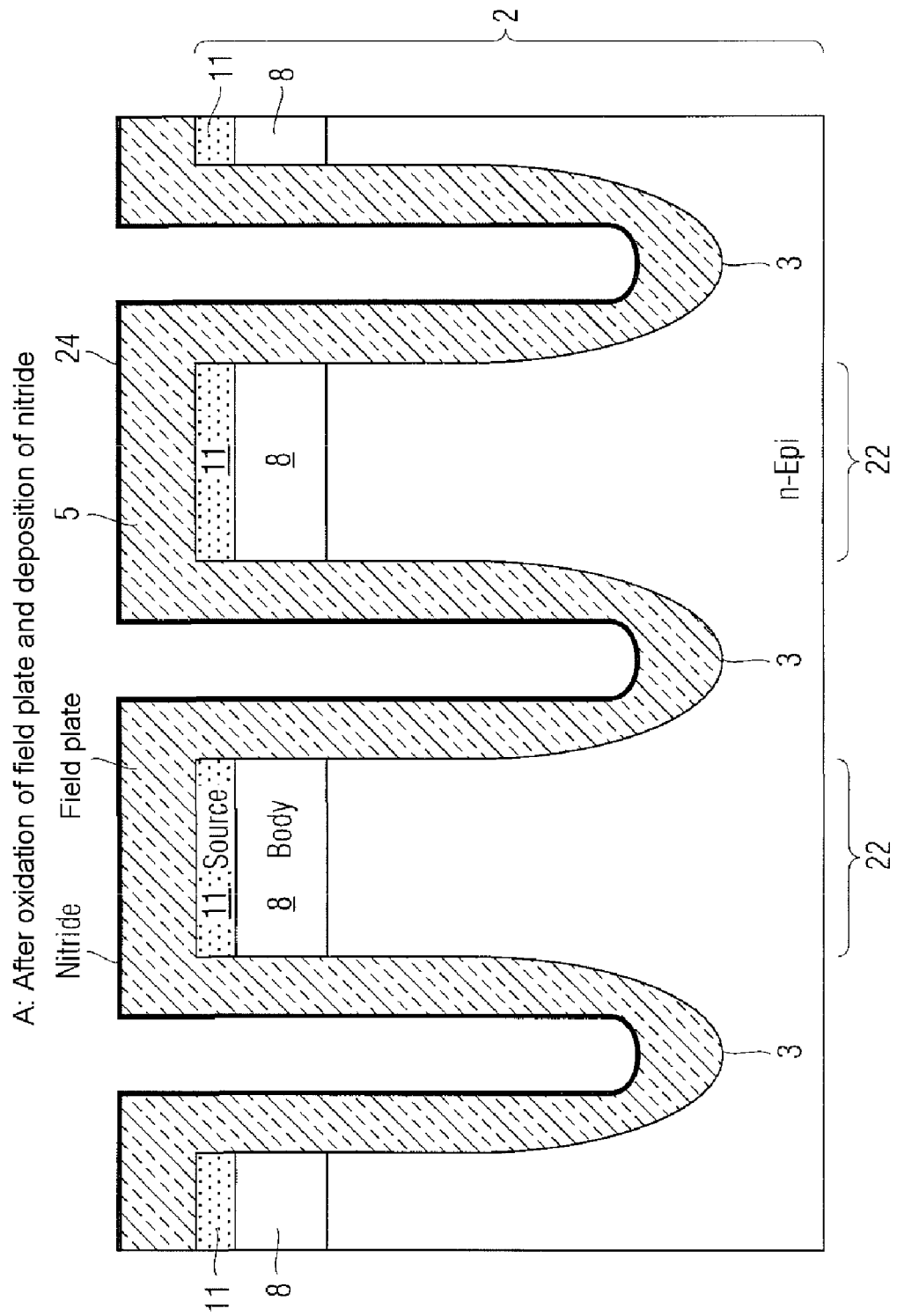
FIG. 8 illustrates a second process of a first embodiment of the production method according to the invention in cross-sectional illustration.
Figure 9:
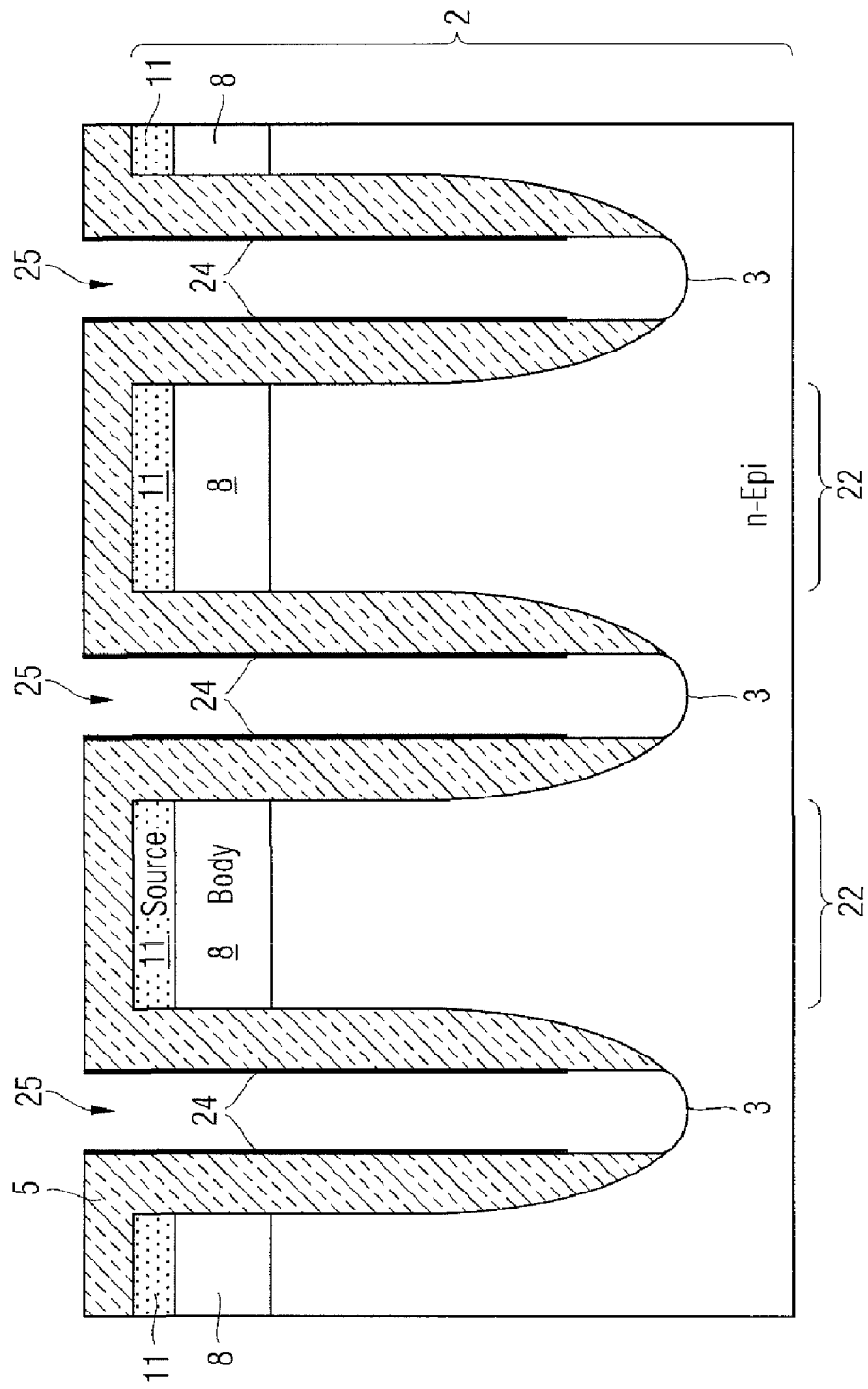
FIG. 9 illustrates a third process of a first embodiment of the production method according to the invention in cross-sectional illustration.
Figure 10:
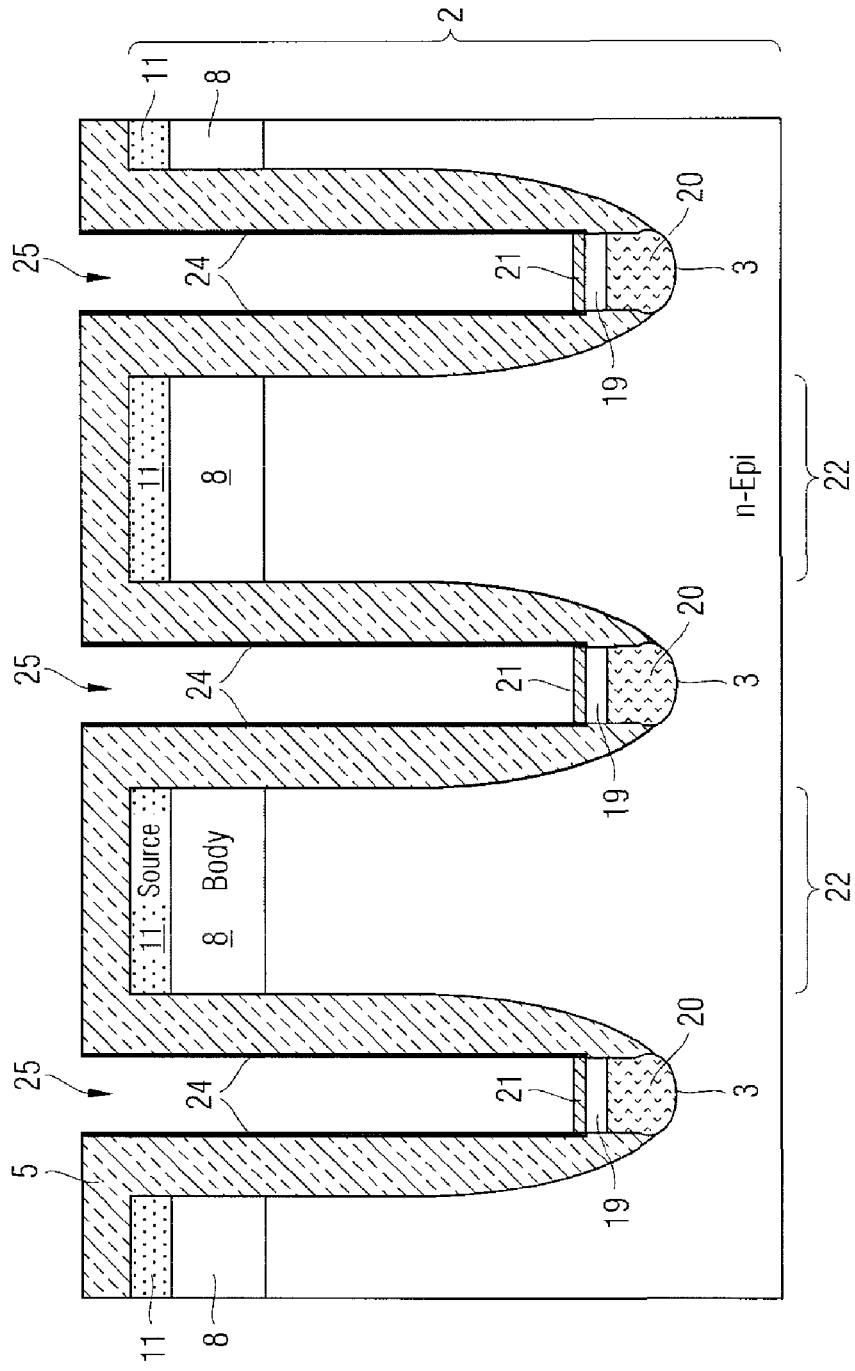
FIG. 10 illustrates a fourth process of a first embodiment of the production method according to the invention in cross-sectional illustration.
Figure 11:
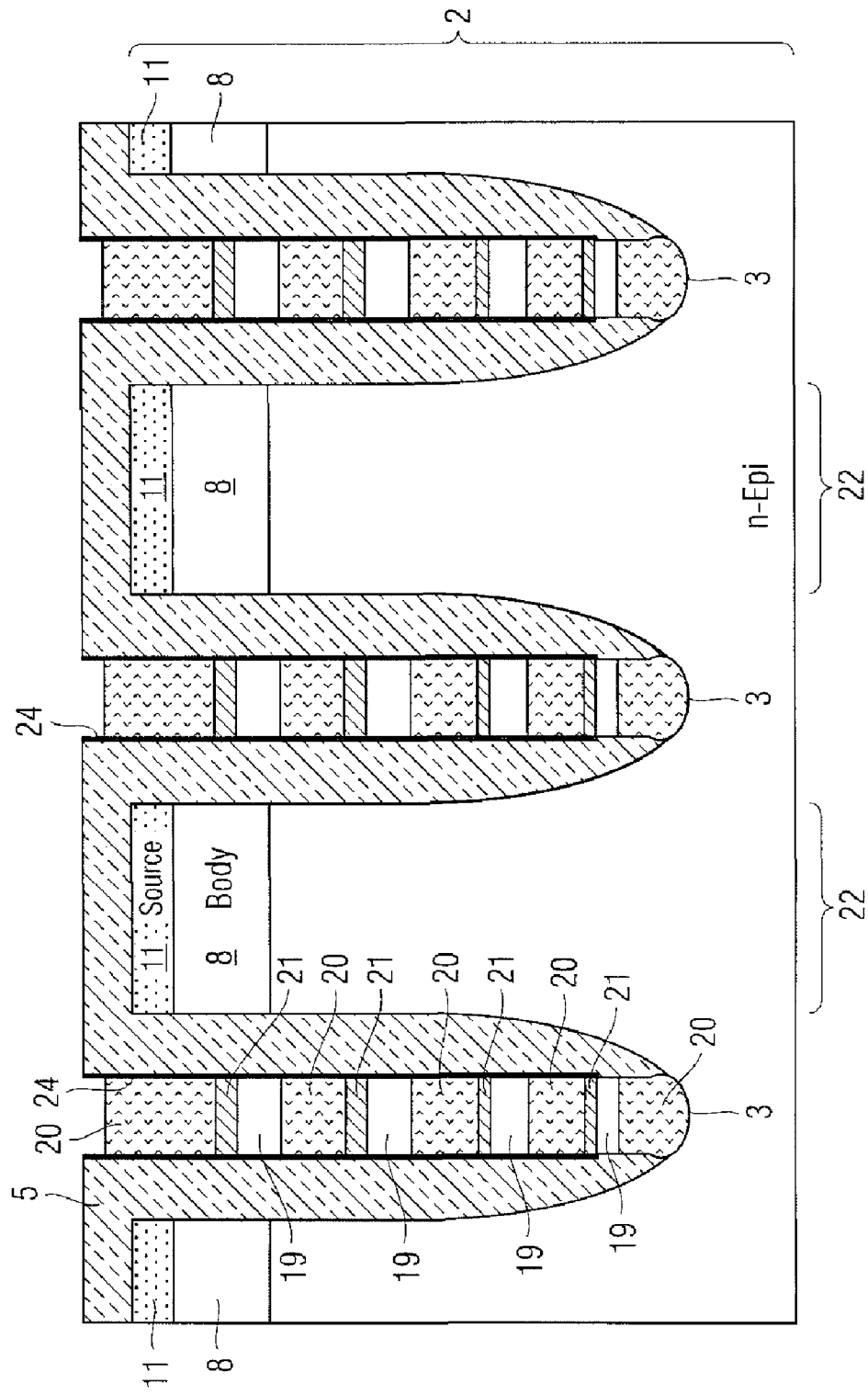
FIG. 11 illustrates a fifth process of a first embodiment of the production method according to the invention in cross-sectional illustration.
Figure 12:
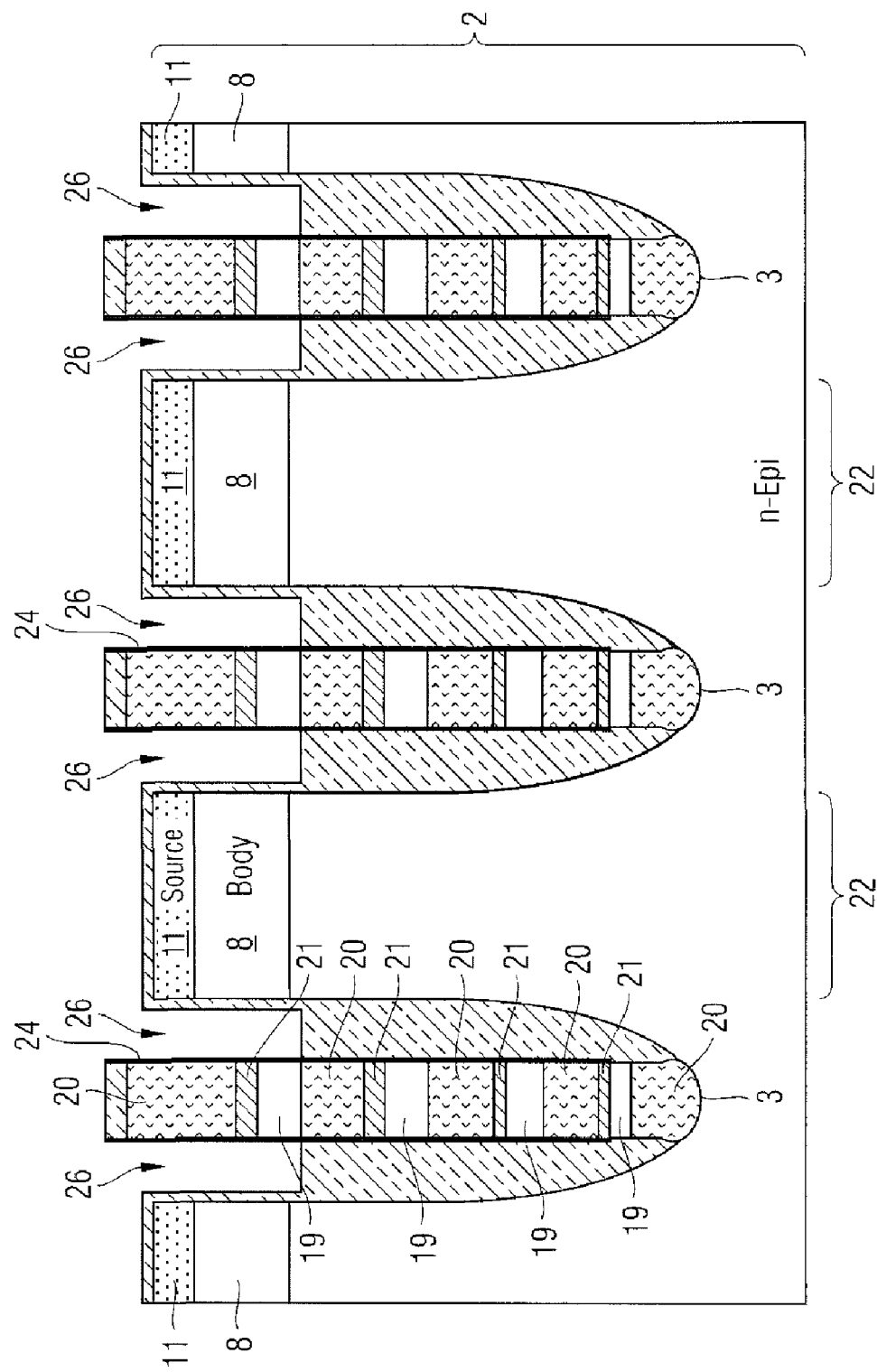
FIG. 12 illustrates a sixth process of a first embodiment of the production method according to the invention in cross-sectional illustration.
Figure 13:
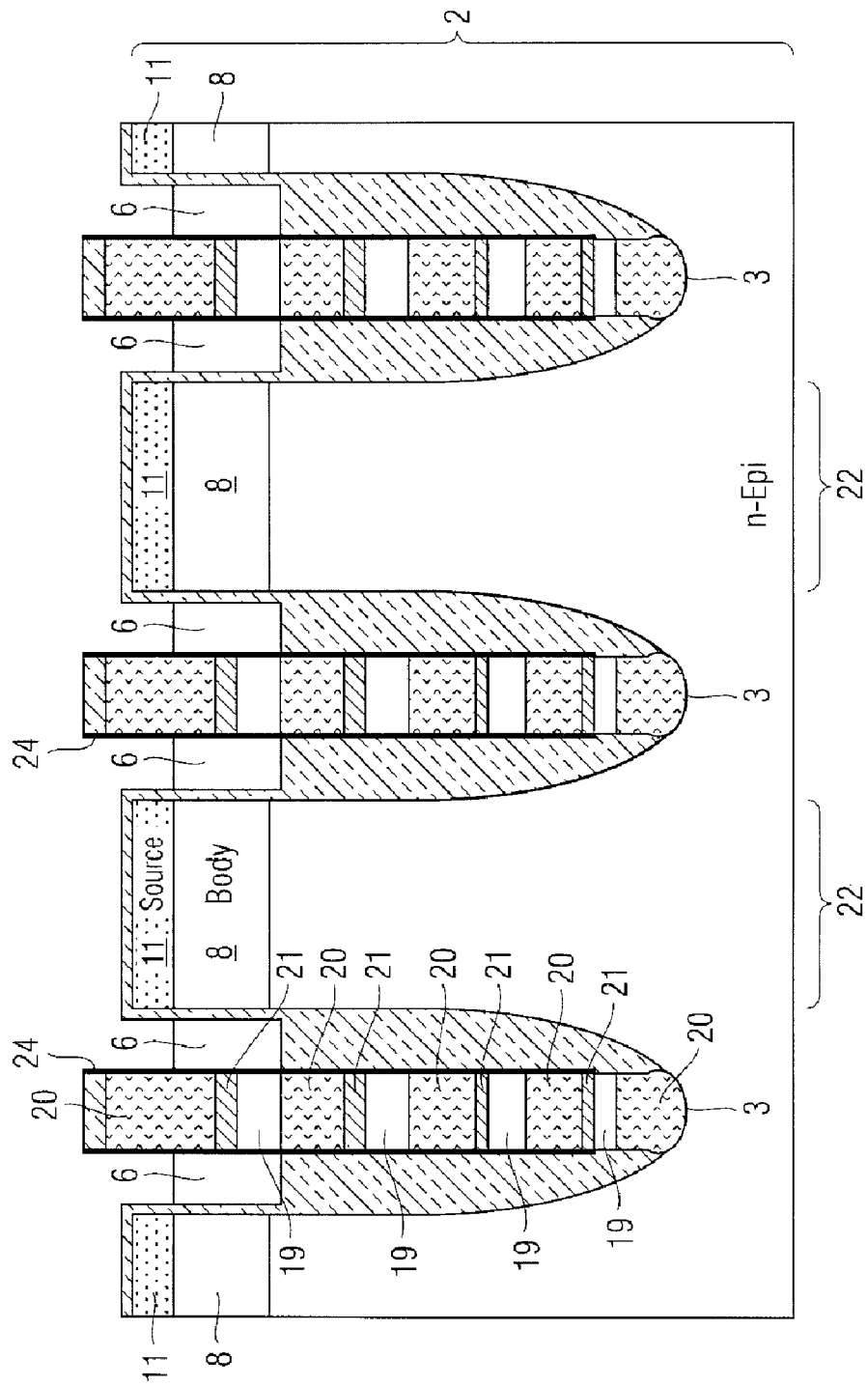
FIG. 13 illustrates a seventh process of a first embodiment of the production method according to the invention in cross-sectional illustration.
Figure 14:
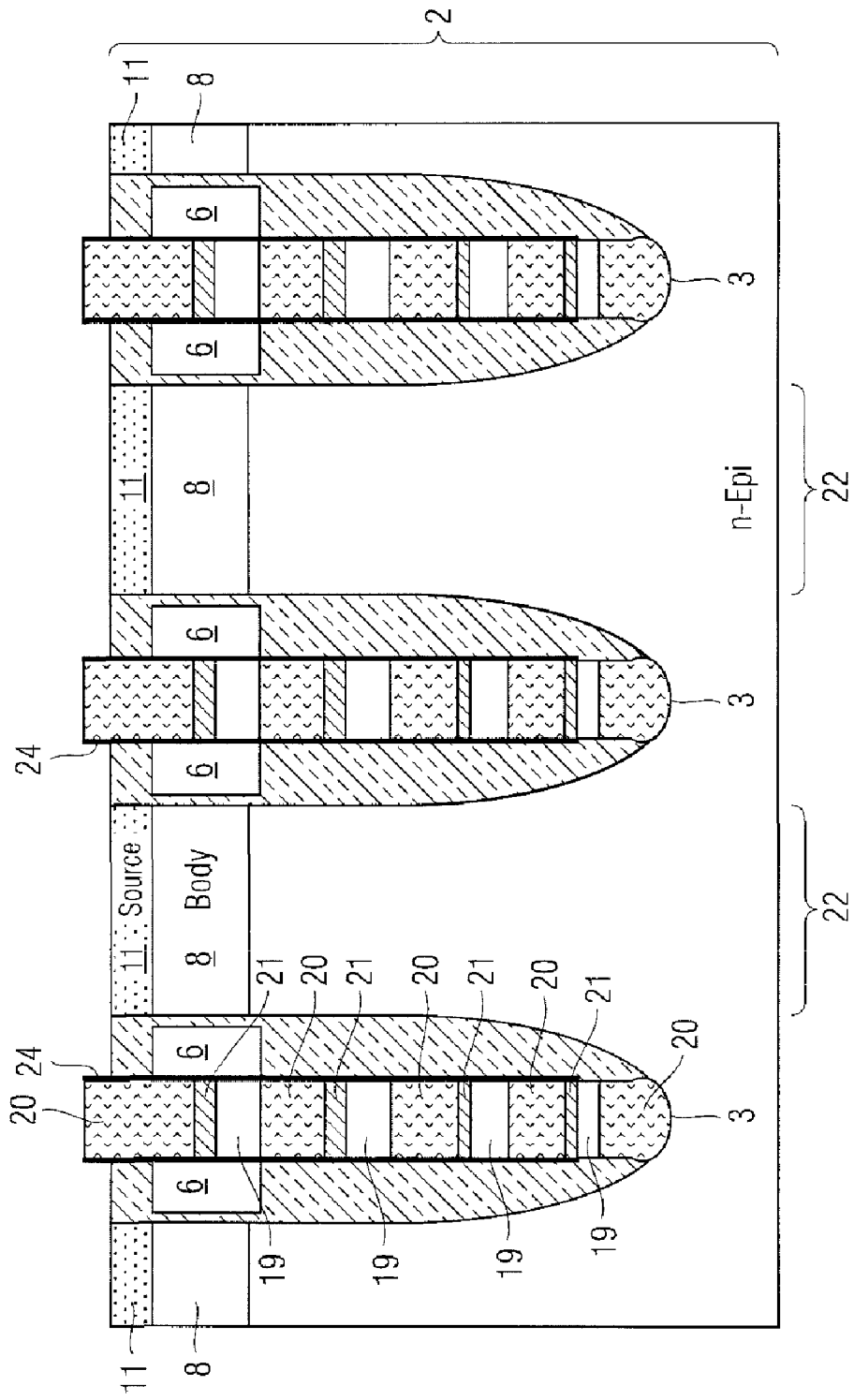
FIG. 14 illustrates an eighth process of a first embodiment of the production method according to the invention in cross-sectional illustration.
Figure 15:
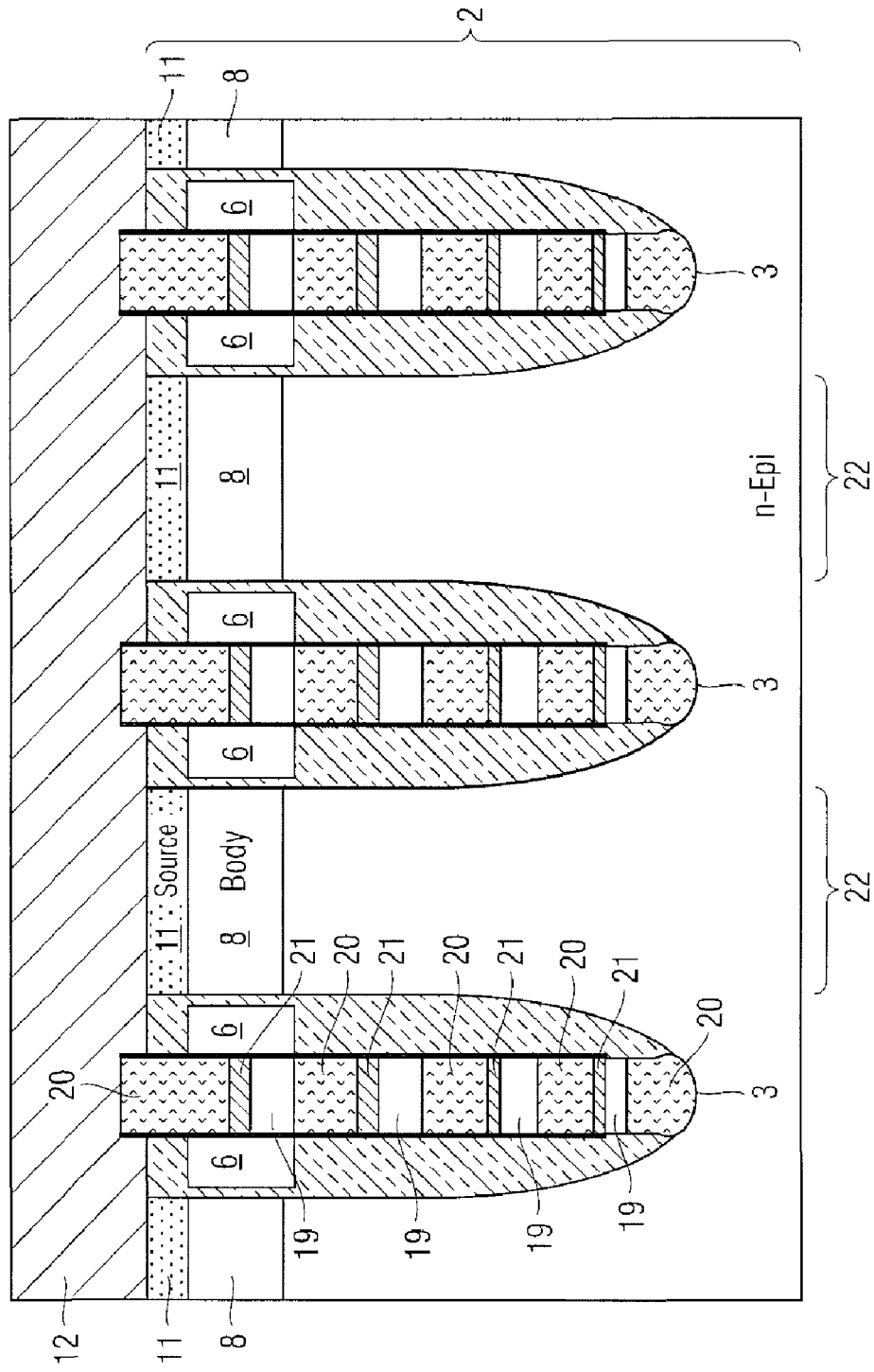
FIG. 15 illustrates a ninth process of a first embodiment of the production method according to the invention in cross-sectional illustration.
Figure 16:
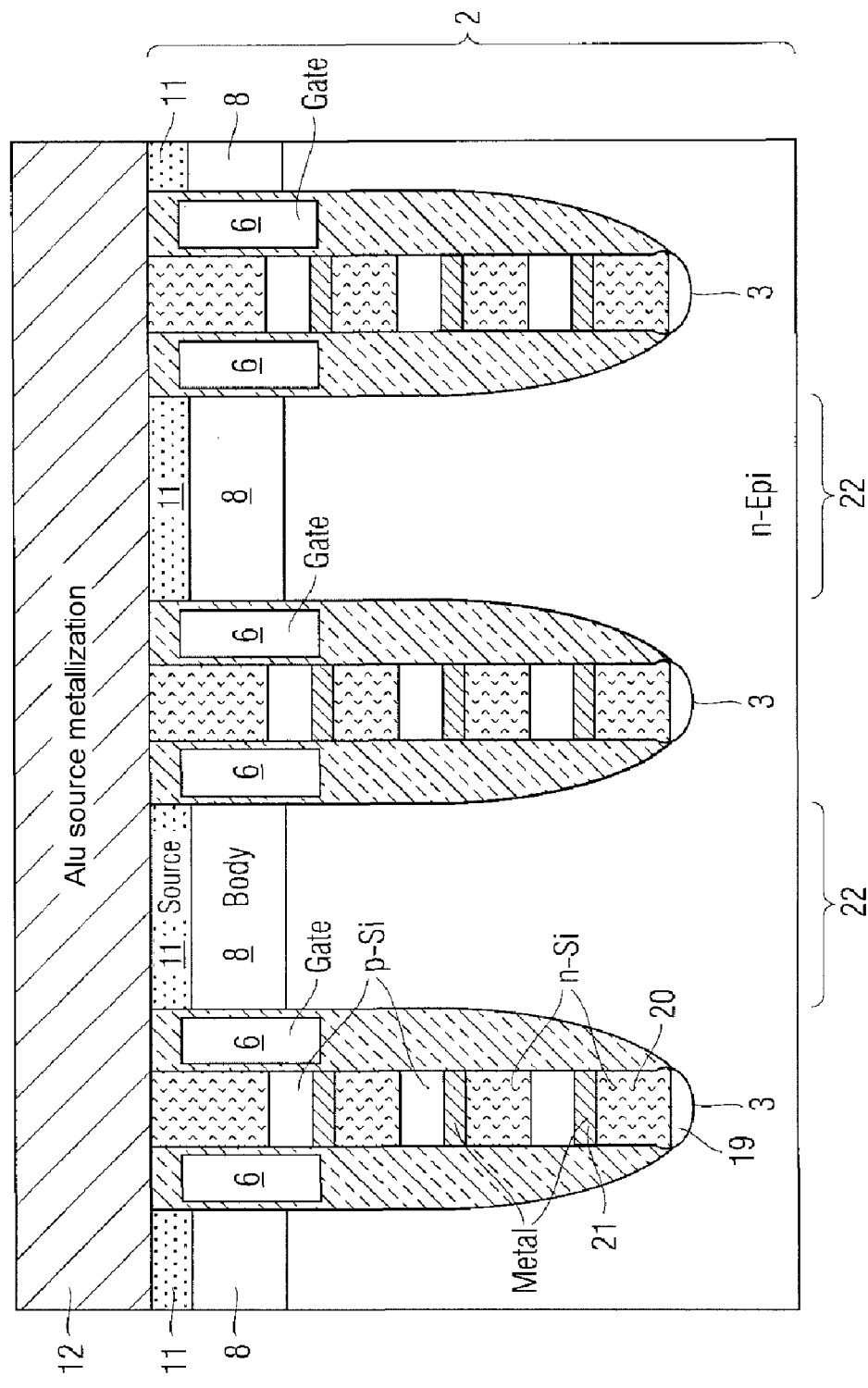
FIG. 16 illustrates a tenth process of a first embodiment of the production method according to the invention in cross-sectional illustration.

In the description below, a first embodiment of the production method according to the invention will be explained with reference to FIGS. 7 to 16. The starting point, as illustrated in FIG. 7, is a semiconductor body 2, in which a trench structure 3 is provided. Body regions 8 and source regions 11 are formed in the mesa zones 22 provided between the trenches of the trench structure 3. A patterned hard mask layer 23 serves for introducing the trench structure 3 into the semiconductor body 2, the hard mask layer being removed again after the trench structure has been introduced into the semiconductor body 2.

In a first process (FIG. 8) a thermal oxidation process is carried out, by means of which parts of the semiconductor material of the semiconductor body 2 are converted into an insulation structure 5 (oxide structure). A nitride layer 24 is deposited on the insulation structure 5.

In a second process (FIG. 9), that part of the insulation structure which is situated in the bottom region of the trench structure 3 and the horizontally running part of the insulation structure 5 and of the nitride layer 24 are completely or partly removed by means of an anisotropic etching-back process. In this case, the etching parameters are chosen such that the free space 25 produced within the trench structure 3, in the bottom region of the trench structure 3, directly adjoins the semiconductor body 2. In a third process (FIG. 10) the free space 25 is filled alternately with p-doped material 19, n-doped material 20 and a metal or metal-containing material 21. This is done until the free space 25 has been completely filled (fourth process, see FIG. 11). Each deposition operation is followed by a corresponding etching-back process which sets the thickness of the p-doped zones 19, of the n-doped zones 20 and of the metal-containing elements 21 to corresponding values. As an alternative, the filling of the free space 25 may be effected by repeatedly performing the following: depositing semiconducting material of one doping type (completely filling the free space 25), etching back the deposited semiconducting material into the free space, carrying out a coating process with regard to the semiconducting material that has remained in the free space (in order to divide the semiconducting material that has remained in the free space into two regions of different doping), producing a silicide layer on the semiconductor conducting material (containing two doping regions).

In a fifth process (FIG. 12) the upper part of the insulation structure 5 is etched back into the trench structure 3. A thermal oxidation process is subsequently carried out, in such a way that cutouts 26 arise in the upper region of the trench structure 3.

In a sixth process (FIG. 13) the cutouts 26 are filled with conductive material, with the result that a gate electrode structure 6 arises.

In a seventh process (FIG. 14) the horizontally running part of the insulation structure 5 is removed by means of an etching-back process. Afterward (FIG. 15) a source metallization 12 is deposited over the whole area of the semiconductor body 2, with the result that the topmost p-doped zone 19 is electrically connected to the source metallization 12, and the bottommost p-doped zone 19 is electrically connected to the semiconductor body 2.

In this way, it is possible to produce a field electrode structure 7, the upper end of which is electrically connected to the source metallization 12, and the lower end of which is electrically connected to the semiconductor body 2. In this way, a series circuit of diodes is formed within the field electrode structure 7, with the result that a continuously falling/rising potential profile occurs within the field electrode structure 7 between the semiconductor body 2 and the source metallization 12. The potential profile brings about a continuous reduction of the potential that is to be reduced in the off-state case.

As an alternative, the production process may also be conducted such that the bottommost n-doped zone 20 is omitted, that is to say is replaced by a p-doped zone 19.

In the description below, a second embodiment of the production method according to the invention will be described with reference to FIGS. 17 to 23.

Figure 17:
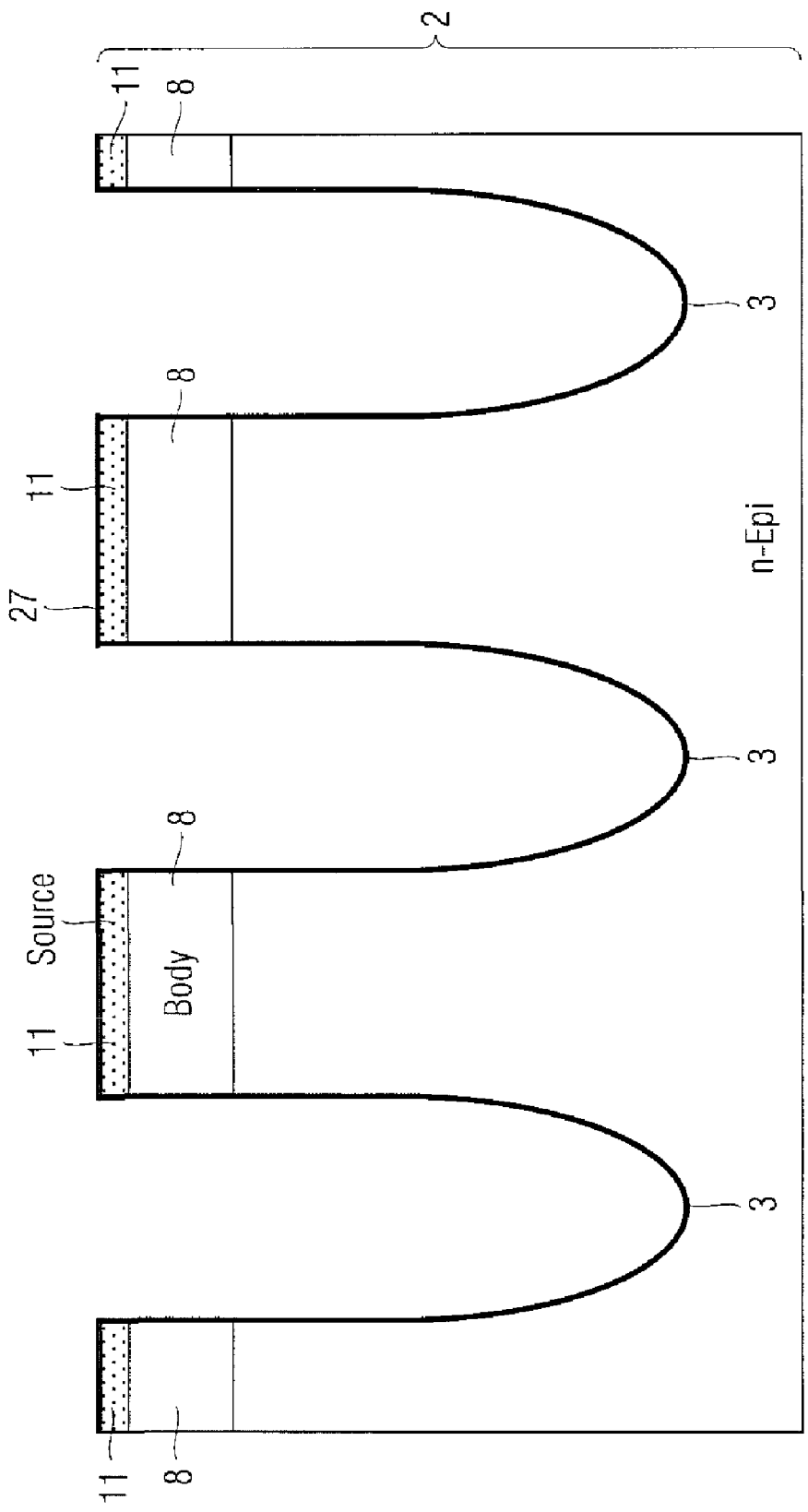
FIG. 17 illustrates a first process of a second embodiment of the production method according to the invention in cross-sectional illustration.
Figure 18:
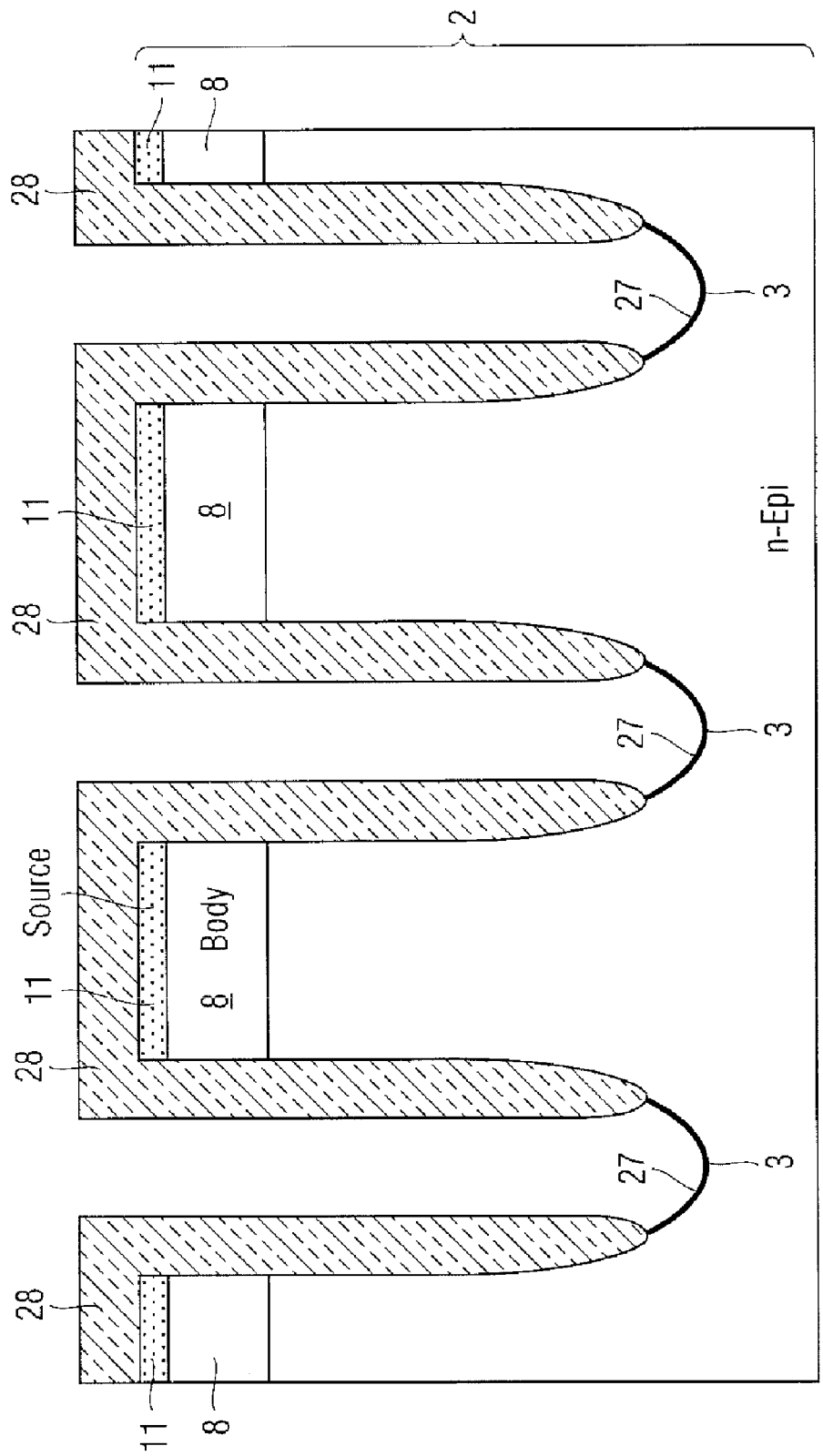
FIG. 18 illustrates a second process of a second embodiment of the production method according to the invention in cross-sectional illustration.
Figure 19:
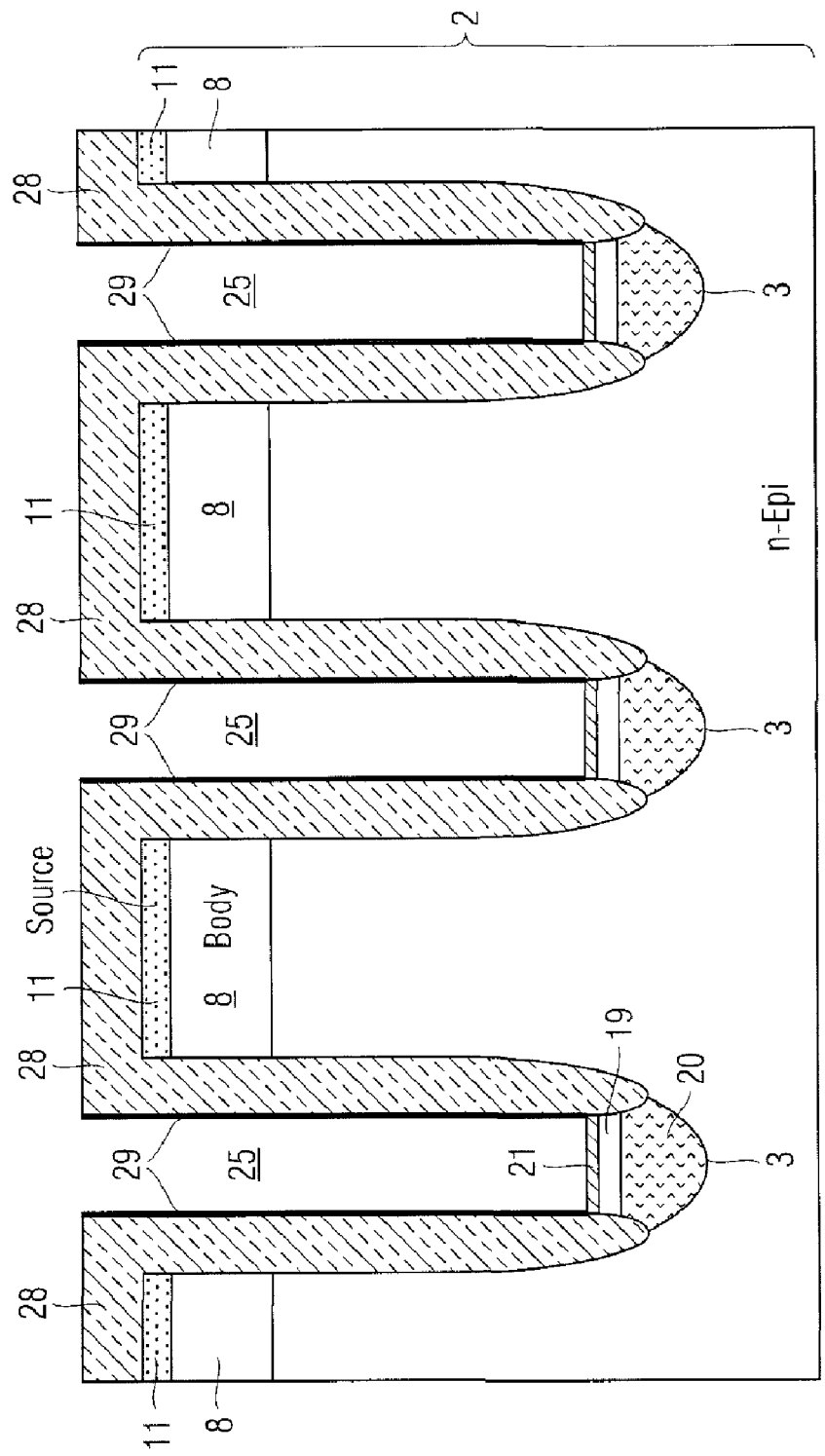
FIG. 19 illustrates a third process of a second embodiment of the production method according to the invention in cross-sectional illustration.

The starting point is the state illustrated in FIG. 17, in which a trench structure 3 has been introduced in a semiconductor body 2 and source regions 11 and body region 8 have been provided in the mesa zones 22. The surface of the semiconductor body 2 is coated with an oxide layer or nitride layer 27.

In a first process (FIG. 18) the nitride layer 27 is patterned in such a way that residues of the nitride layer 27 remain only in the bottom region of the trench structure 3. A thermal oxidation process is subsequently performed, whereby an oxide layer 28 is formed on the parts of the semiconductor body 2 which are not covered by the nitride layer 27.

In a second process (FIG. 19), the residual parts of the nitride layer 27 are removed and a further nitride layer 29 is deposited across the entire semiconductor body 2, the horizontally running parts of the further nitride layer being removed by means of an anisotropic etching process. The free spaces 25 that have remained in the trench structure 3 are filled by deposition and etching-back processes with an alternating arrangement of p-doped zones 19, n-doped zones 20 and metal elements or metal-containing elements 21 (e.g., silicide or tungsten).

Figure 20:
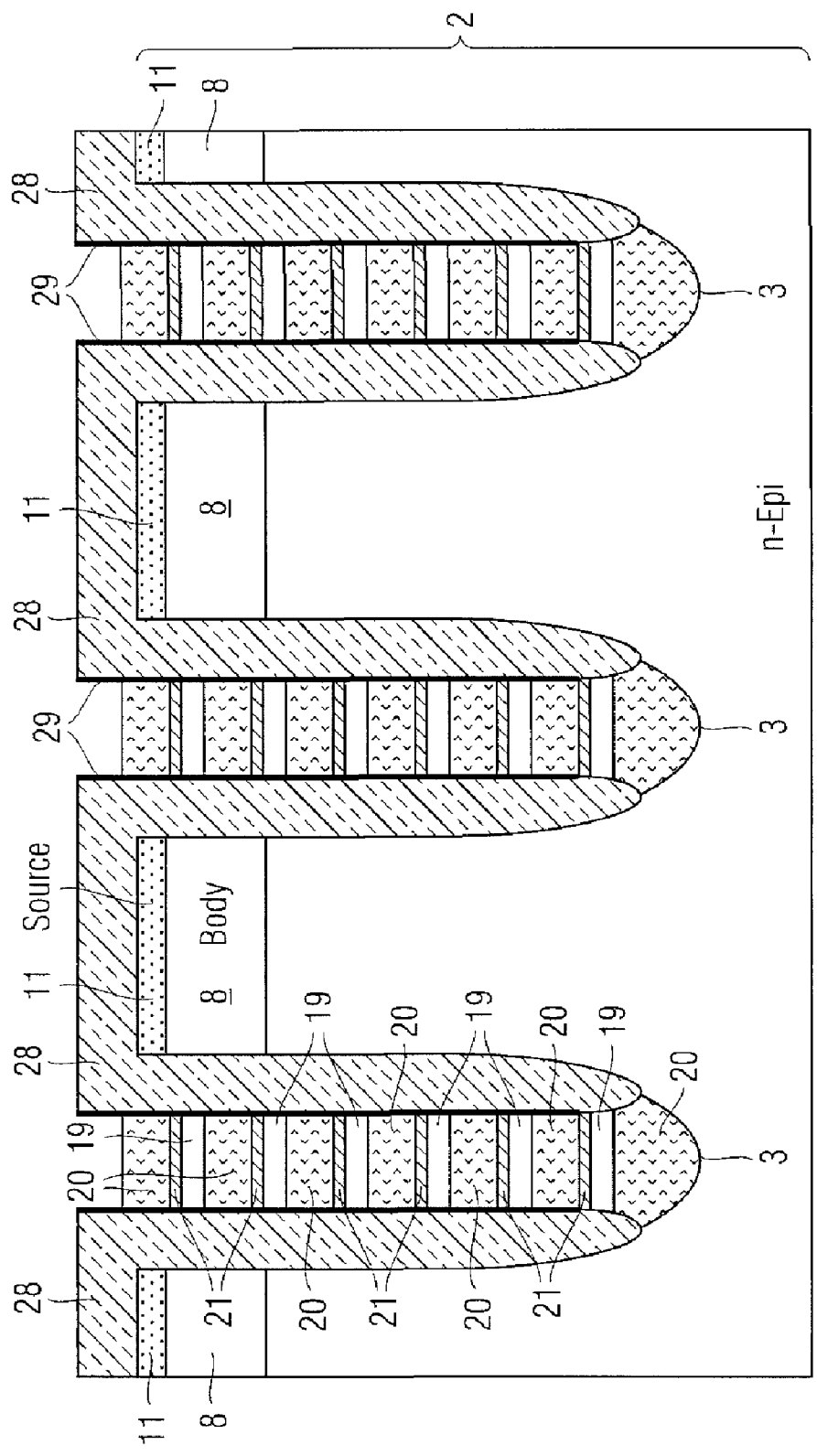
FIG. 20 illustrates a fourth process of a second embodiment of the production method according to the invention in cross-sectional illustration.
Figure 21:
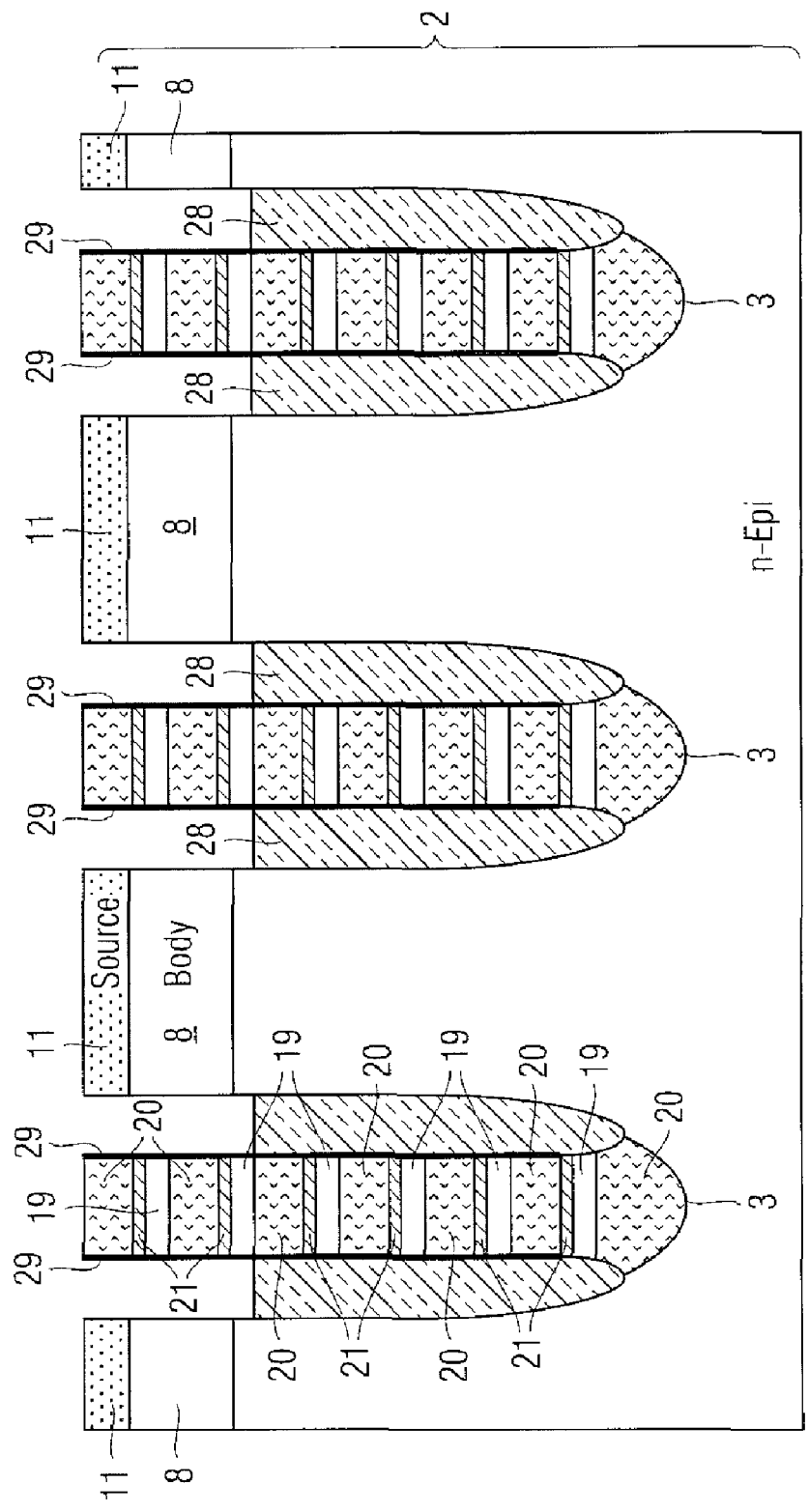
FIG. 21 illustrates a fifth process of a second embodiment of the production method according to the invention in cross-sectional illustration.
Figure 22:
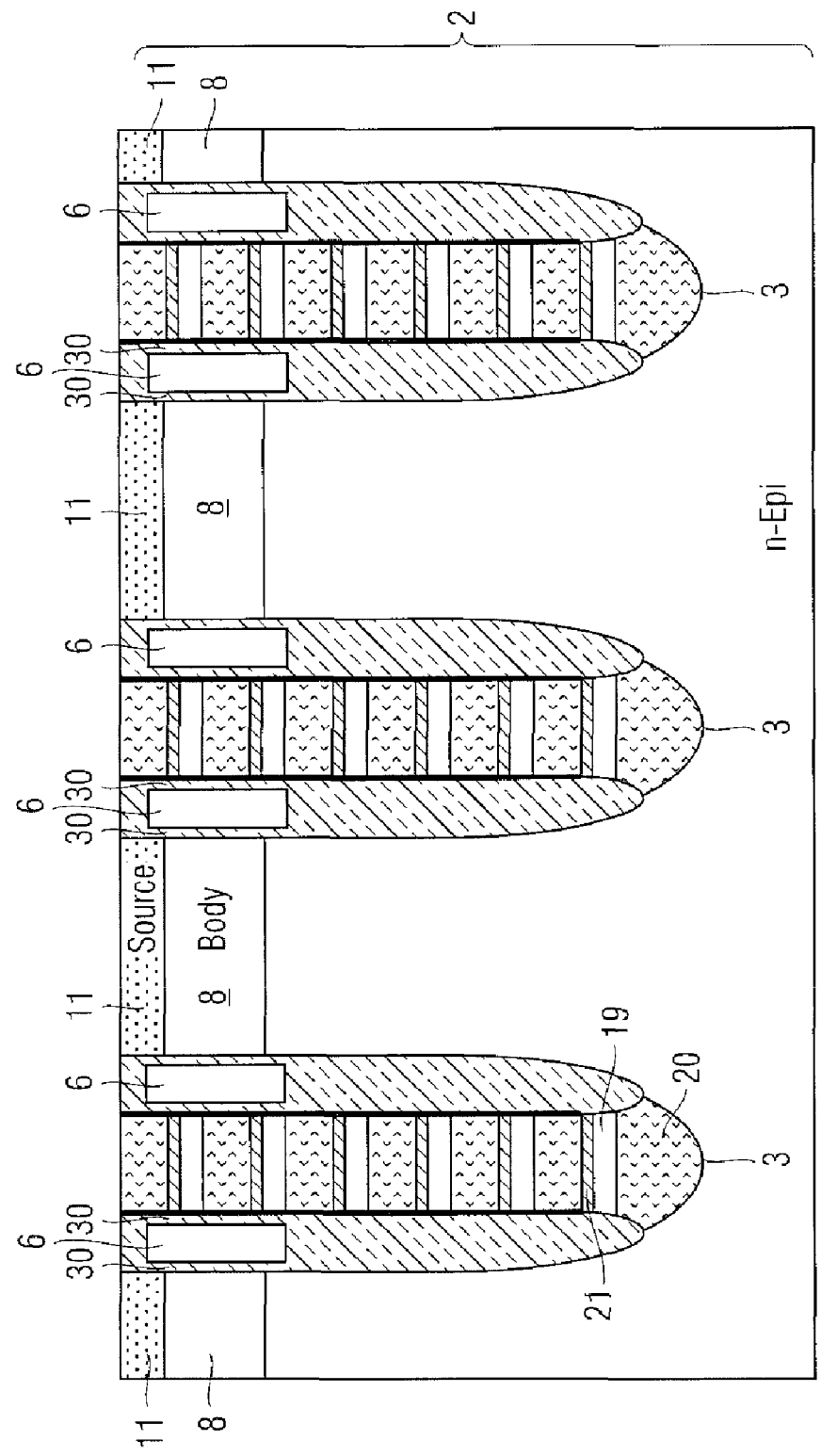
FIG. 22 illustrates a sixth process of a second embodiment of the production method according to the invention in cross-sectional illustration.
Figure 23:
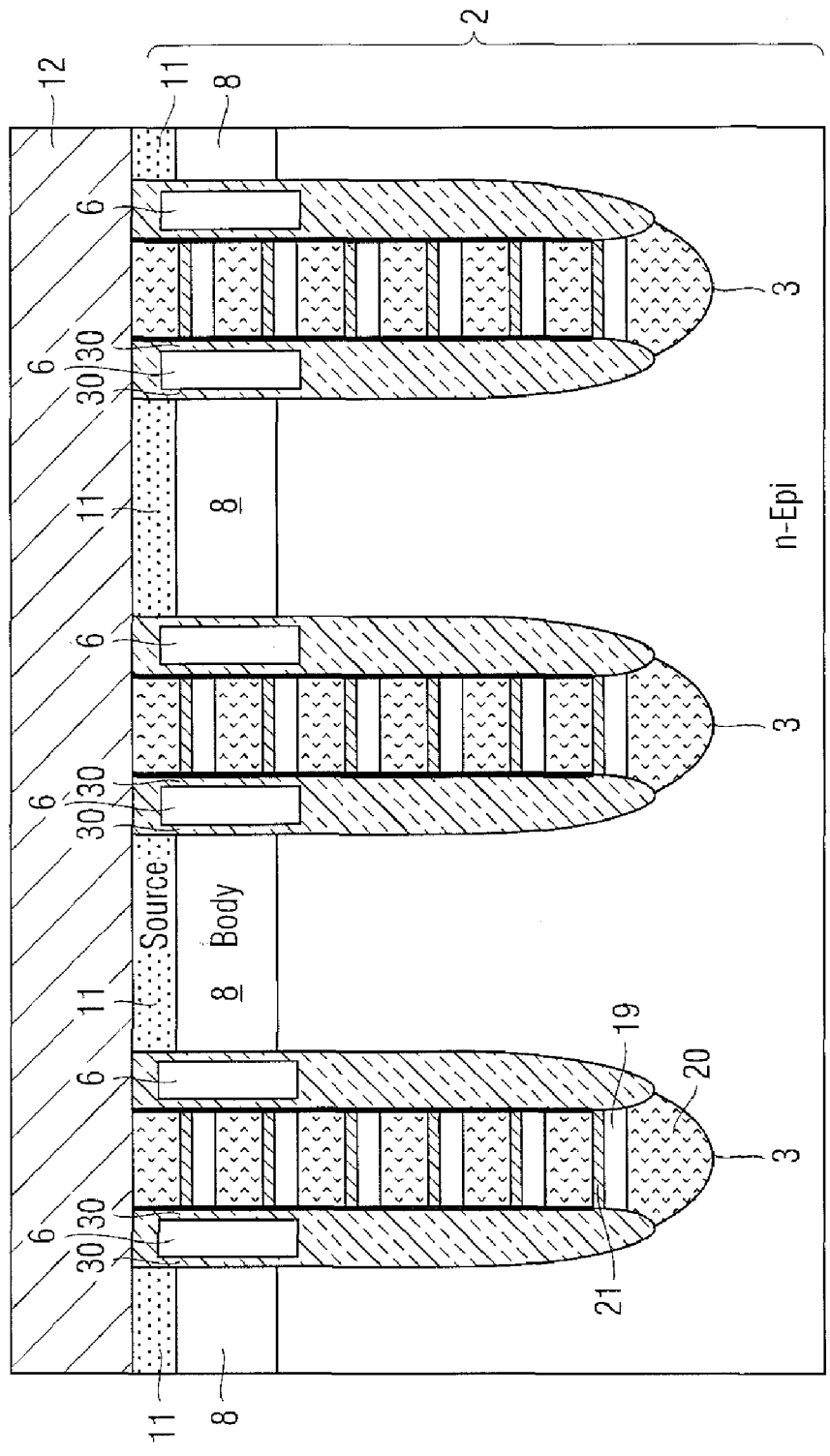
FIG. 23 illustrates a seventh process of a second embodiment of the production method according to the invention in cross-sectional illustration.

The free spaces 25 are filled up to a vertical position lying above the vertical position of the surface of the source regions 11 (FIG. 20). In a fifth process (FIG. 21) a CMP process is carried out (chemical mechanical polishing). The upper part of the oxide layer 28 is subsequently etched back into the trench structure 3 by means of an etching process.

The resulting cutouts in the insulation structure 5 are then lined with an oxide layer 30 (gate oxide), and a gate electrode structure 6 is introduced into the free spaces that have still remained.

Finally (FIG. 23), a source metallization 12 is deposited, which contact-connects both the source regions 11 and the topmost n-doped zones 20 of the field electrode structure 7.

Figure 24:
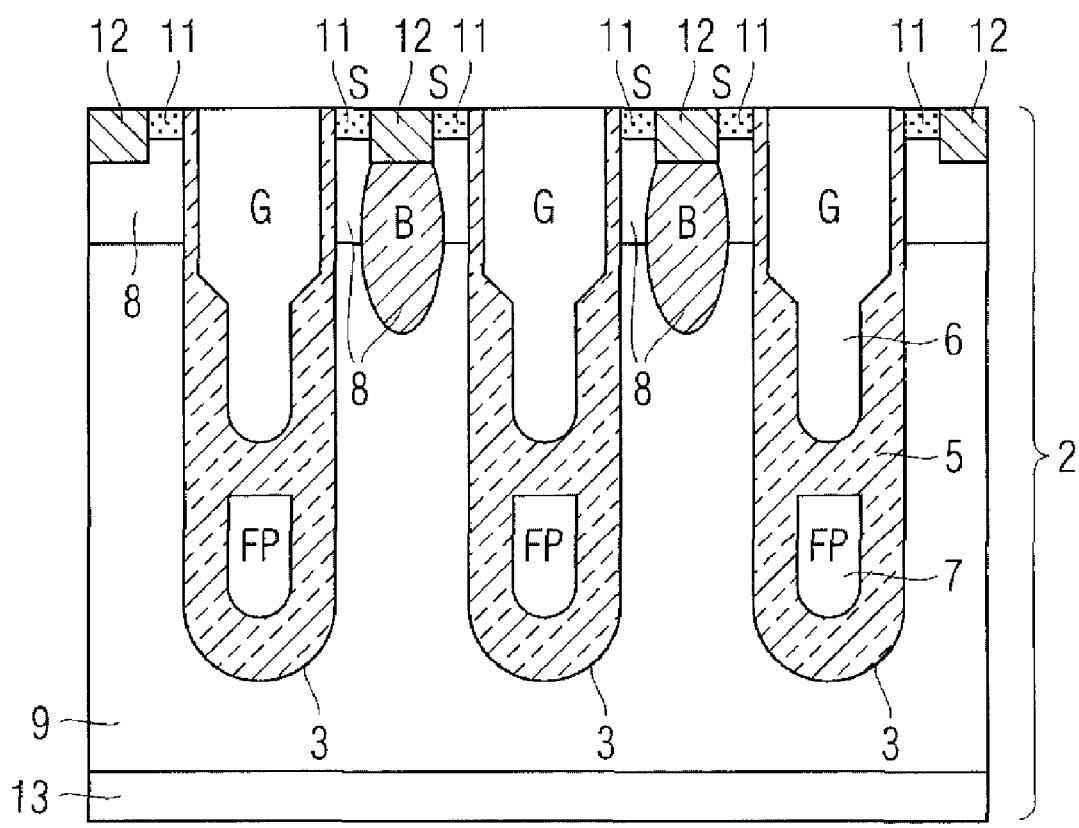
FIG. 24 illustrates an extract from a known field plate trench transistor in cross-sectional illustration.

FIG. 24 illustrates an extract from a conventional field plate trench transistor, which differs from the field plate trench transistor illustrated in FIG. 1 merely in terms of the concrete configuration of the gate electrode structure 6 and the concrete configuration of the body region 8.

Figure 25A:
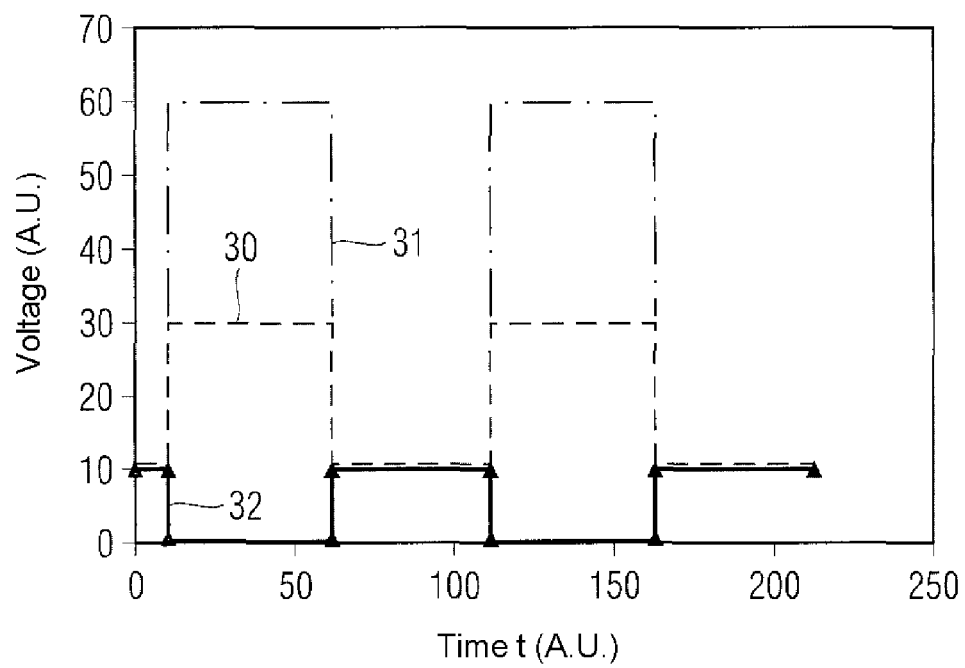
FIG. 25 illustrates diagrams showing the ideal voltage/current profile within a field electrode structure of a field plate trench transistor.
Figure 25B:
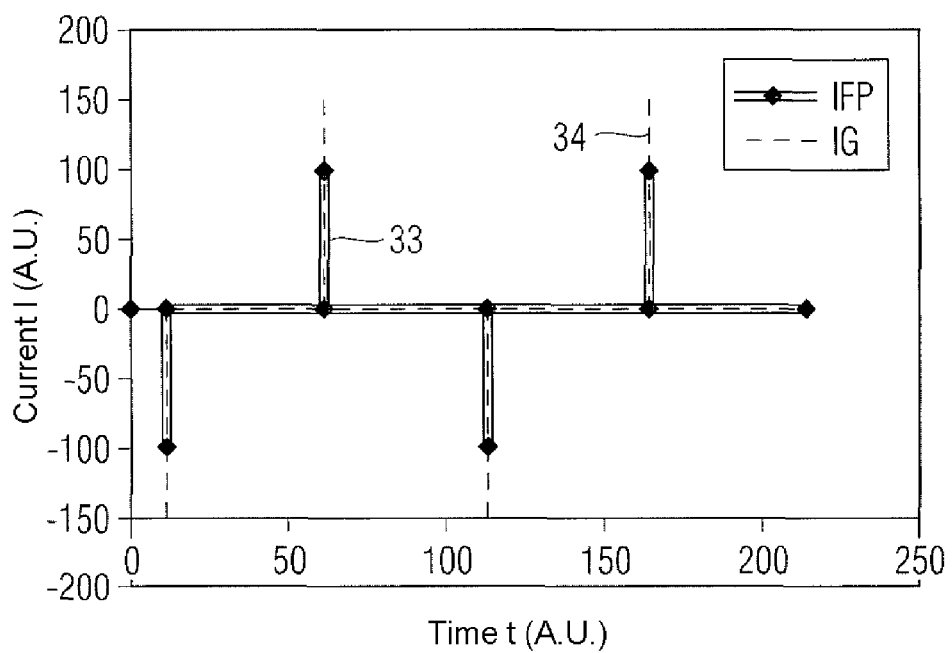

FIG. 25(a) illustrates the ideal voltage profile 30 of the field electrode structure 7 for a given drain voltage profile 31 and gate voltage profile 32, FIG. 25(b) illustrates the ideal charging current profile 33 of the field electrode structure 7 and the gate electrode charging current profile 34 corresponding thereto: with ideal circuitry connection, FP must block in both directions relative to the rear side. The charging currents of the field plate have the same direction as the gate charging currents. The field plate must be subjected to charge reversal relative to source (or drain) if the gate driver is not to be loaded.

Figure 26:
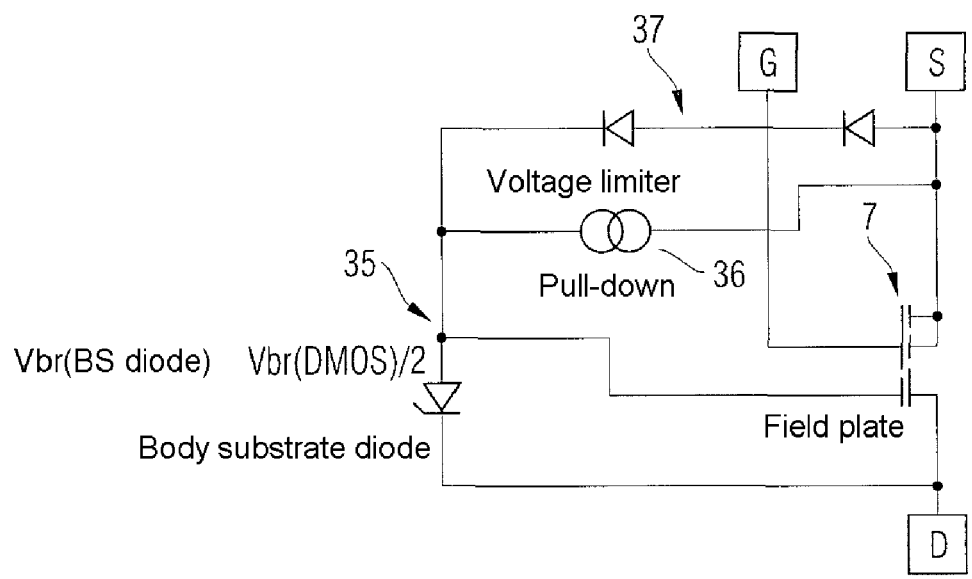
FIG. 26 illustrates a basic schematic circuit diagram of a fifth embodiment of the field plate trench transistor according to the invention.

In order to achieve at least approximately ideal voltage and current profiles in the field electrode structure 7 (also referred to as field electrode structure or field plate), a field electrode structure 7 is used which is connected to a substrate diode structure 35, a pull-down structure 36 and a voltage limiting structure 37 in the manner specified in FIG. 26. "G", "S" and "D" are to be understood to mean gate potential, source potential and drain potential. The following should be noted with regard to the functioning of this circuit:

a) Transistor switched off:
body substrate diode with pull-down element holds the field plate voltage at $V_D$-$V_{br}$ (body substrate diode)
pull-down current is conducted away via source
b) Transistor switched on:
the pull-down holds the field plate at source potential and thus limits the Ron loss due to an excessively low field plate potential
c) Switch-on operation:
drain voltage drops
the field plate is thus pulled capacitively in the direction of negative voltages
the voltage limiting element prevents the voltage from dropping to large negative voltages
the pull-down element "pulls" the field plate voltage (with a certain delay) to source potential
d) Switch-off operation:
drain voltage rises
field plate voltage concomitantly rises capacitively
in order that it does not rise excessively highly, the discharge current of the field electrode-substrate capacitance possibly has to flow away via pull-down element or voltage limiting element.

Figure 27:
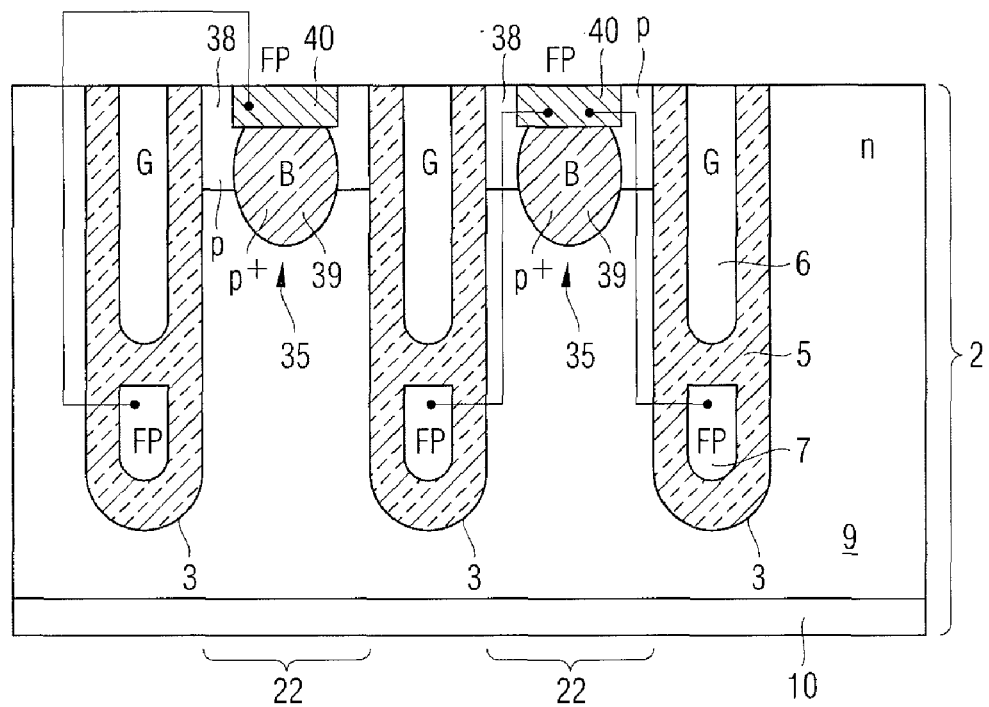
FIG. 27 illustrates a detail view of an extract from one possible realization of the embodiment illustrated in FIG. 26.
Figure 32:
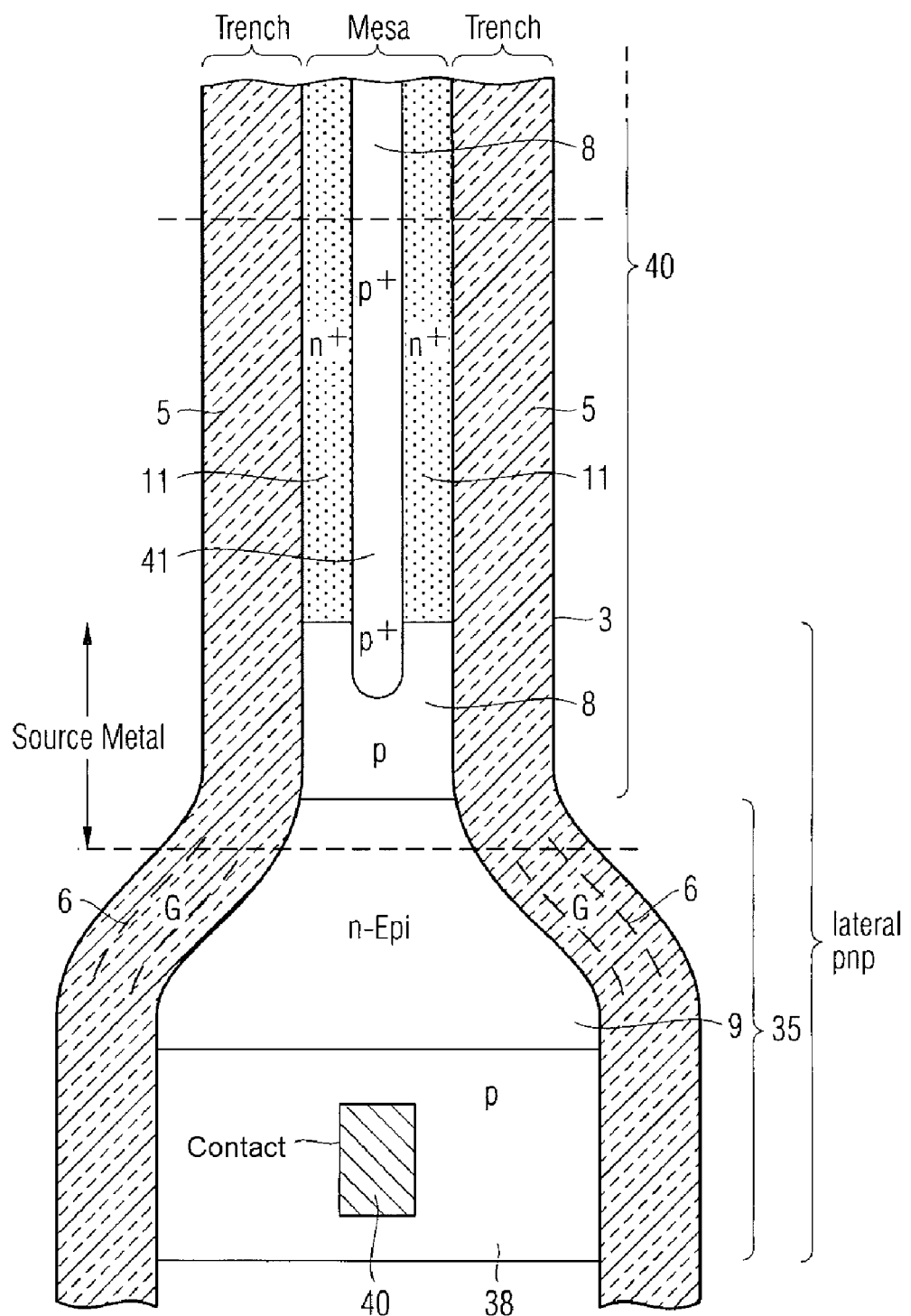
FIG. 32 illustrates a plan view of one possible realization of the embodiment illustrated in FIG. 26.

FIG. 27 discloses an example of an embodiment of the substrate diode structure 35 illustrated in FIG. 26. The substrate diode structure 35 includes pn junctions between p-doped semiconductor zones 38/p$^+$-doped semiconductor zones 39 provided within the mesa zones 22 and the parts of the semiconductor body 2 (n-doped) which lie below the semiconductor zones, each of the pn junctions forming a part of the substrate diode structure 35. Contact-connections 40 are provided in the upper region of the p-doped zones 38, and are electrically connected to the field electrode structure 7. FIG. 32 illustrates a plan view of a field plate trench transistor according to the invention in order to illustrate that the region in which the substrate diode structure 35 is formed is spaced apart from the cell array region 47 of the field plate trench transistor. The p-doped zones 38 can be produced together with the body regions 8 in one process. The p$^+$-doped zones 39 can be produced together with corresponding body contact zones 41 in one process.

Figure 33:
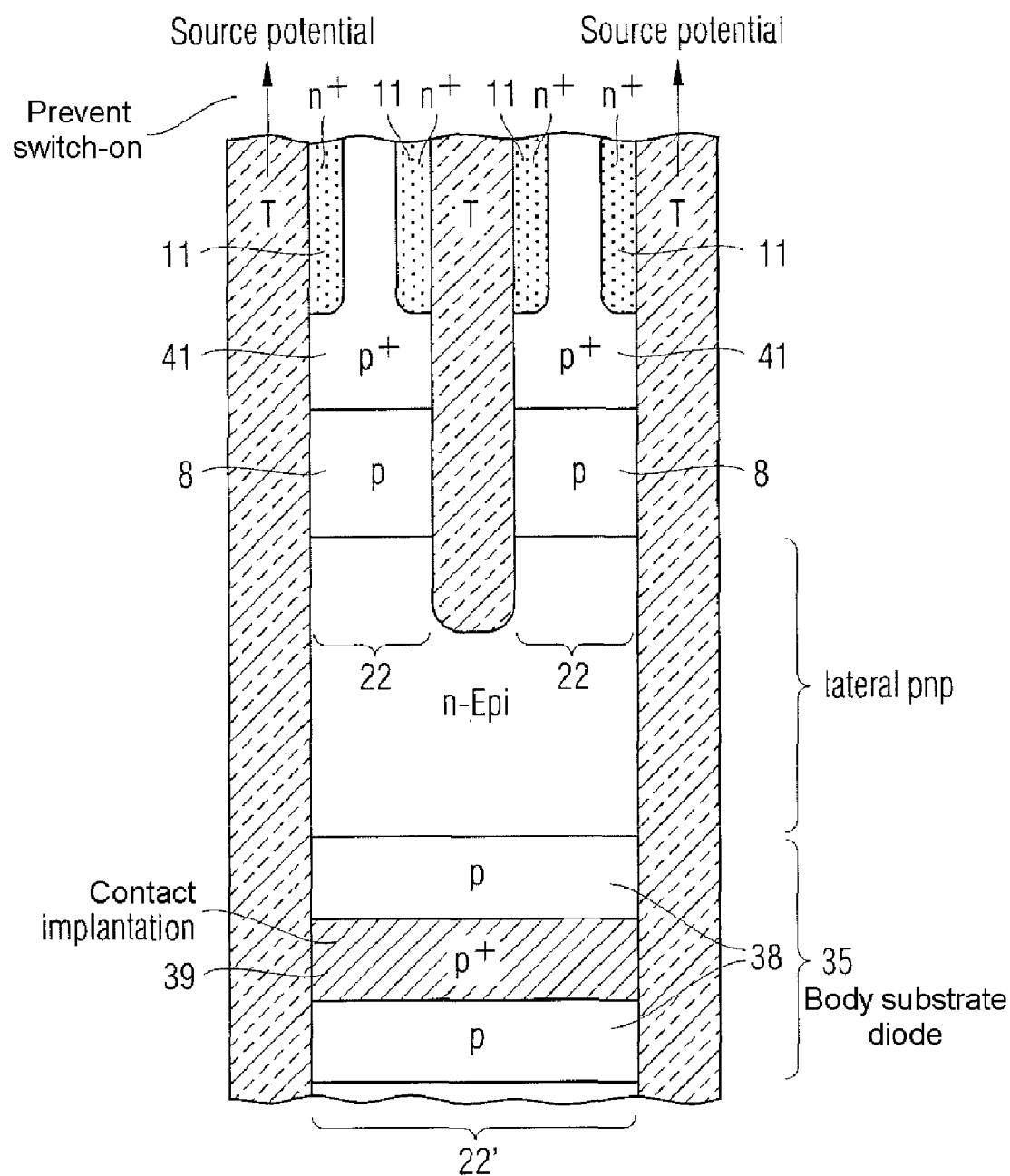
FIG. 33 illustrates a plan view of one possible realization of the embodiment illustrated in FIG. 26.

FIG. 32 illustrates the case where the width of the mesa zone 22 in which the substrate diode structure 35 is formed is wider than the mesa zone 22 of the cell array region. FIG. 33 illustrates the case where the width of the mesa zone 22' in which the substrate diode structure 35 is formed is twice as wide as the mesa width 22 within the cell array region 47. By means of the mesa zone 22' which is twice as wide, it is possible to obtain a reduction of the breakdown voltage of the substrate diode structure in comparison with the breakdown voltage of the transistor elements localized within the cell array region 47. The breakdown voltage is freely selectable by variation of the mesa width down to approximately 50% of the breakdown voltage of the cell array. The breakdown is pinned in the mesa center at least in technology variants with body reinforcement and is thus noncritical with regard to drift processes.

Figure 28:
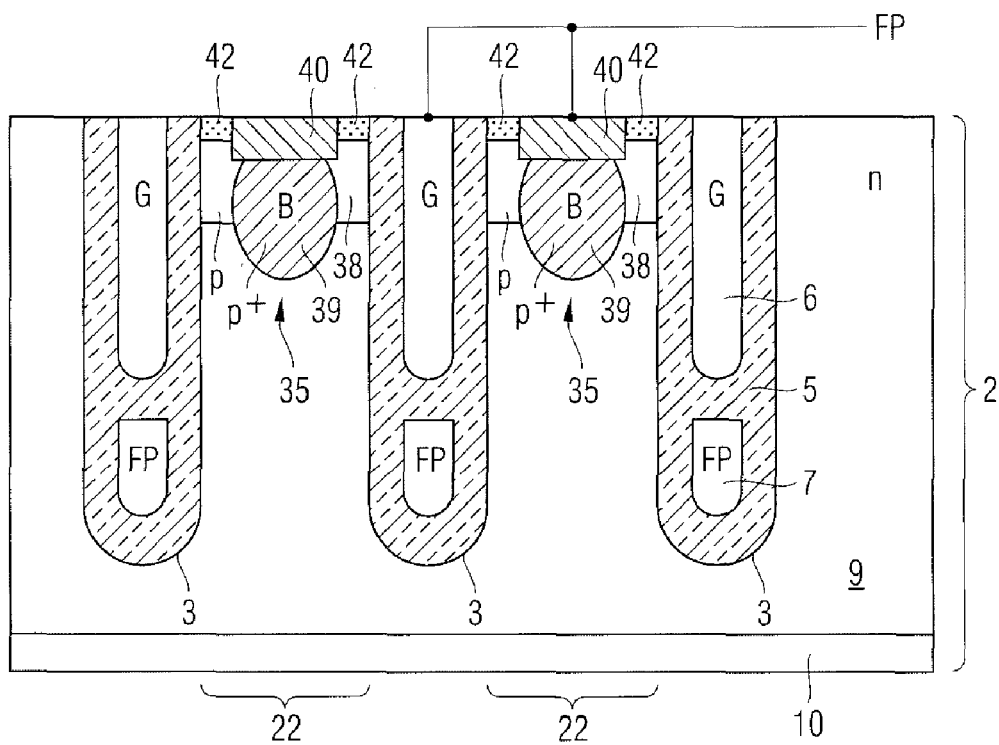
FIG. 28 illustrates a detail view of an extract from one possible realization of the embodiment illustrated in FIG. 26.
Figure 34:
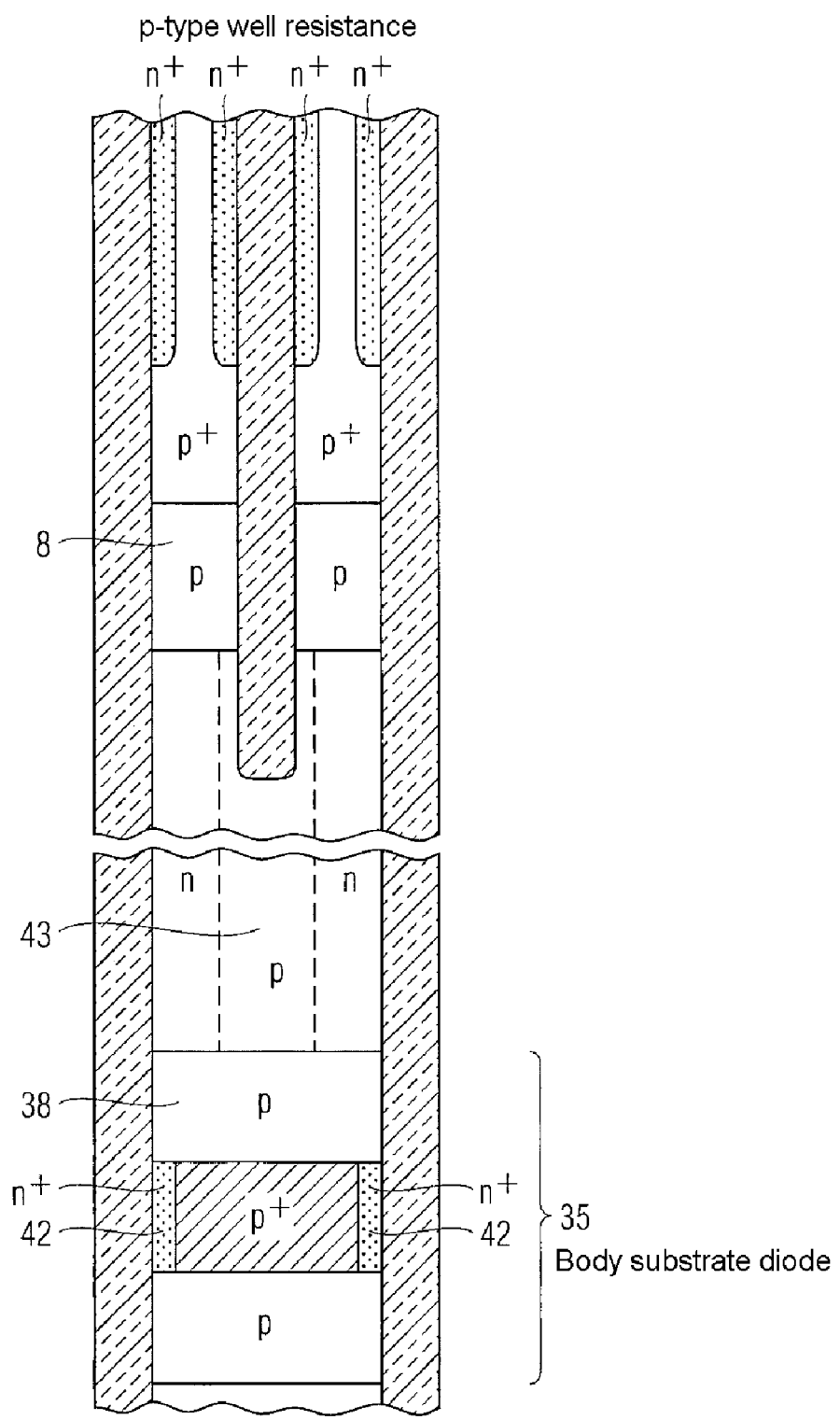
FIG. 34 illustrates a plan view of one possible realization of the embodiment illustrated in FIG. 30.

FIG. 28 illustrates that n$^+$-doped zones 42 can be provided within the p-doped zone 38, the pn junction formed from the n$^+$-doped zone 42 and the p-doped zone 38 corresponding to the voltage limiting structure 37 illustrated in FIG. 26. This case is likewise illustrated in plan view in FIG. 34. Furthermore, FIG. 34 illustrates a resistance element 43 having a p-doped zone which is formed in the drift region 9 and connects the body region 8 of the cell array to the p-doped zone 38 of the substrate diode structure 35. The resistance element 43 corresponds to the pull-down structure 36 illustrated in FIG. 26. FIG. 28 accordingly illustrates a body substrate diode with integrated NMOS for voltage limiting during switch-on. When the transistor is switched on, the thick oxide transistor in the body substrate diode is also switched on. The NMOS transistor prevents the field electrode from being pulled capacitively to negative voltages. During switch-off, the NMOS transistor remains switched on for a certain period of time and prevents the field plate potential from concomitantly rising too far.

Figure 29:
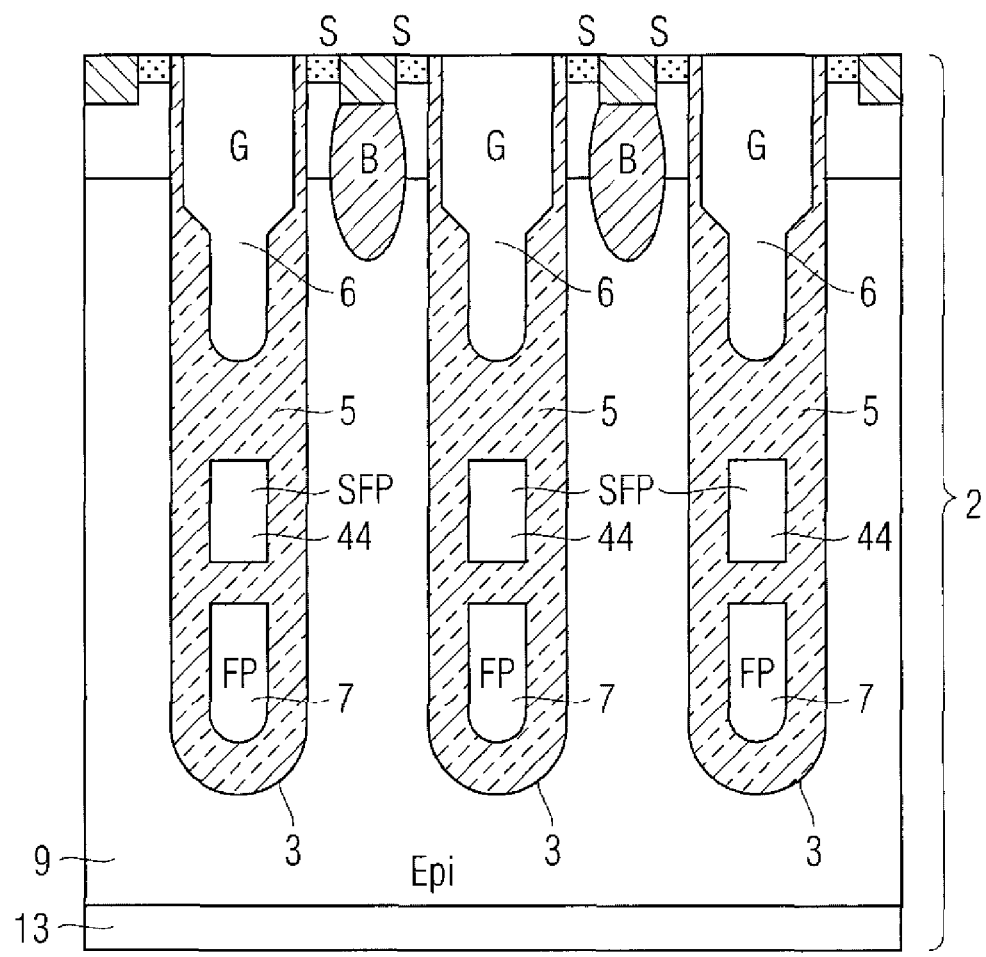
FIG. 29 illustrates a detail view of an extract from one possible realization of the embodiment illustrated in FIG. 26.

FIG. 29 illustrates an alternative embodiment of the cell array region 47, in which an electrode shielding structure 44 is provided between the field electrode structure 7 and the gate electrode structure 6 within the trench structure 3, and can prevent or reduce a capacitive coupling of the field electrode structure 7 to the gate electrode structure 6. The electrode shield structure 44 has to be connected to source with relatively low impedance in order to be able to conduct away the large charge-reversal currents during switching. The dielectric between electrode shielding structure and field electrode structure 7 must have the same dielectric strength as the dielectric between field electrode structure 7 and silicon epitaxial layer. The capacitance ratio of electrode shielding structure/field electrode structure and field structure/silicon epitaxial layer must be approximately 1:1 in order that the charge-reversal currents can be conducted away capacitively during switching.

Figure 30:
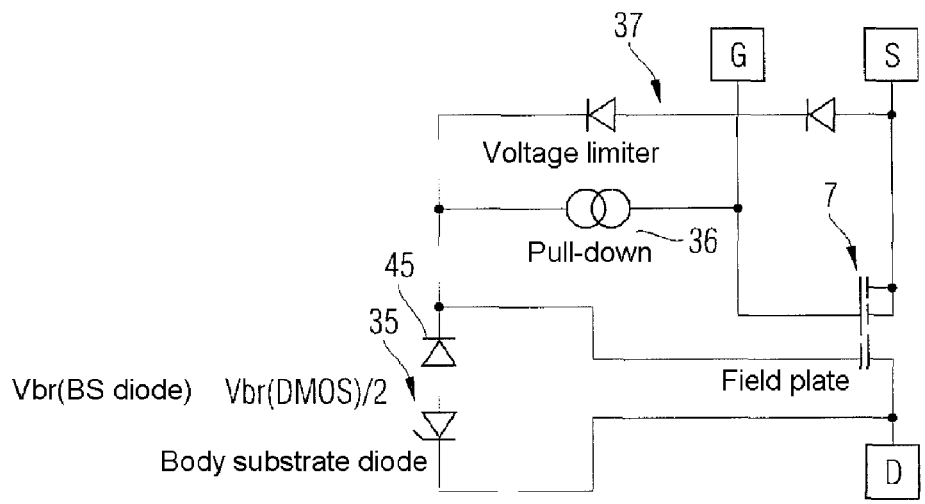
FIG. 30 illustrates a basic schematic circuit diagram of a seventh embodiment of the field plate trench transistor according to the invention.
Figure 31:
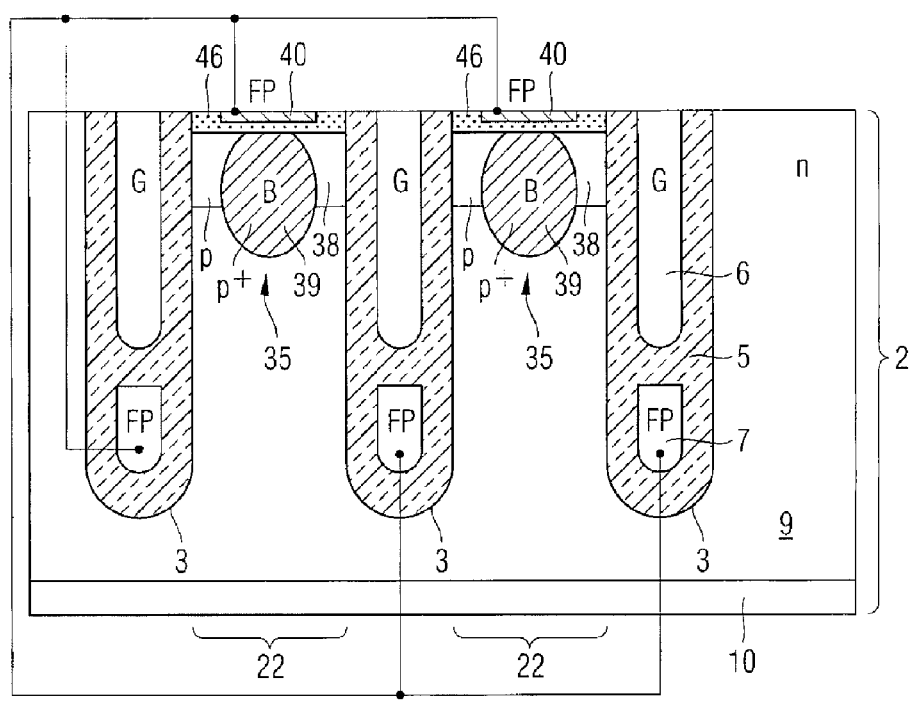
FIG. 31 illustrates an extract from one possible realization of the embodiment illustrated in FIG. 30, in cross-sectional illustration.

FIG. 30 illustrates an alternative interconnection of the substrate diode structure 35 with respect to FIG. 26. The difference is that a further diode structure 45 is provided and the pull-down structure 36 is connected to gate potential. FIG. 31 discloses one possible realization of the interconnection illustrated in FIG. 30. The essential difference with respect to the embodiment illustrated in FIG. 28 is that the n$^+$-doped zones 42 have been merged to form a common n$^+$-doped zone 46 with the result that the p$^+$-doped zones do not directly adjoin the contact-connections 40. The following should be noted with regard to the functioning of the circuit illustrated in FIG. 30:

Transistor switched off:
body substrate diode with pull-down elements holds field plate voltage at $V_D$-$V_{br}$ (body substrate diode)
pull-down current is conducted away via external gate shunt
Transistor switched on:
the pull-down element holds the field plate at gate potential and thus optimizes Ron by forming an accumulation layer in the lower trench region
additional diode prevents a forward current from drain to field plate
Switch-on operation:
drain voltage falls
the field plate is thus pulled capacitively in the direction of negative voltages
the voltage limiting element prevents the voltage from falling to large negative voltages
the pull-down pulls the field plate voltage (with a certain delay) to gate potential
Switch-off operation:
drain voltage rises
the field plate voltage concomitantly rises capacitively
in order that it does not rise excessively highly, the discharge current of the field plate-substrate capacitance possibly has to flow away via pull-down or voltage limiter.

Further embodiments of the invention will be explained in the description below.

In the conventional field plate trench transistor, the polysilicon filling of the trench is completely at gate potential or is divided into an upper region at gate potential and a lower region at source potential. In any event the polysilicon in the trench is completely connected to the low side of the switch. This means that the oxide in the trench bottom (depending on specific embodiment) has to withstand almost the full reverse voltage of the transistor. This condition limits the thickness of the oxide toward the bottom. However, the minimum trench width is also determined with the oxide thickness. Since the mesa width has actually already been reduced to a minimum in the present field plate trench technology, there is only little shrink potential in this concept. Likewise, this limitation means it is not possible to expand the field plate trench concept to voltage classes above 200 V.

The documents U.S. Pat. No. 6,677,641 B2 and DE 10339455.9 describe the idea of incorporating into the trench bottom region one or a plurality of further field plate(s) which, in the off-state case, is (are) held at intermediate potentials between source and drain and thus enable(s) a step-by-step reduction of the voltage even in the trench. The oxides in the trench then only have to take up in each case part of the reverse voltage and can thus become thinner. This means that the way is free for further shrinks of the field plate trench technology and for expanding the concept to higher voltage classes.

In the application the question remains open as to how the intermediate potentials mentioned can be generated within a discrete MOS switch technology. The invention specifies a number of possibilities in this respect.

According one embodiment of the invention, by means of a voltage divider one or a plurality of electrodes lying one below another in the trench are brought to a potential between source (low side) and drain (high side) in such a way that only a fraction of the voltage difference (drain-source) is present laterally between the electrode and silicon mesa.

As a result, the field plate oxide can be made thinner and the transistor can be shrunk further. The voltage divider is realized by at least one zener diode and a resistor or by a plurality of series-connected zener diodes. The zener diodes are integrated either in the chip edge as a separate component or vertically in the field plate technology. The nodes between the components are thus at a defined potential between source and drain. In order to prevent the np junctions from blocking when the transistor is switched on, and to provide the possibility for discharging the field plates when the transistor is switched on, e.g., metallic short circuits are used according to the invention.

One embodiment of the invention accordingly consists in realizing the driving of an additional deep field electrode in the trench of the DMOS cell by means of a series circuit including at least one zener diode and a resistor or by means of a series circuit having a plurality of zener diodes. The potentials established at the nodes between the components are thus held at the desired potential between source and drain. In the dynamic case (switch-on: the field plate is "pulled" capacitively below the source potential), the diodes which are forward-biased with respect to the source prevent the field electrode being "pulled" below n×Vf (n=number of zener diodes between the electrode and source, Vf=forward voltage of the zener diodes). During switch-off, the zener breakdown of the diodes prevents the potential of the electrode from being able to rise above the defined zener voltage. With the use of zener diodes within the field electrode, moreover, the lead resistance for charge reversal is drastically reduced in the dynamic case, which has a particularly effect on the switching times. No additional space is required in this case.

FIG. 1 illustrates a known trench transistor (realized in SFET3 EDP). The additional electrode in the lower trench region is fixedly connected up to the source. This means that the field plate oxide must be made thick enough to withstand the maximum source-drain voltage. FIG. 2 illustrates an external voltage divider which connects the field electrode toward drain with a zener diode. The zener diode is intended to have a breakdown voltage which is expediently half the source-drain breakdown voltage of the transistor. The resistor to source prevents the electrode potential from drifting in the off-state case as a result of the leakage current of the zener diode in the direction of the drain voltage. During switch-off, the resistor prevents the field electrode from being pulled capacitively to negative potentials. This last is achieved more effectively if a diode is connected in parallel with the resistor (FIG. 3).

In this case, the resistor may have a very high resistance or be entirely obviated. The diodes may be produced in a body well between two trenches by means of additional implantation zones or by means of polydiodes on field oxide at the edge of the chip. FIG. 4 illustrates how a plurality of insulated, vertically arranged electrodes have to be connected to a voltage divider having a plurality of zener diodes in order to achieve even smaller potential differences between electrode and drift zone. FIG. 5 illustrates the realization by means of n-type and p-type zones in a polysilicon strip and metal short circuits which may be situated on the chip edge.

FIG. 6 illustrates a structure in which the zener diodes are integrated into the vertical field electrode. FIGS. 7 to 23 describe two possible production methods A and B showing how vertical zener diodes (zener diode chains) of this type could be produced. The following process would be necessary for a diode structure in the trench: deposition and etching-back of doped polysilicon (n-doped for n-MOS transistors), counterdoping near the surface by coating (e.g., from the vapor phase), self-aligned silicide (e.g., TiSi) for forming an ohmic contact between p-type and n-type polysilicon. As a result, the diode chain is switched to the on state in the reverse direction.

In one embodiment of the invention, the lowered breakdown voltage of a body substrate diode with a larger mesa width (or without a trench boundary) is used to generate a suitable intermediate voltage between rear side and front side.

A description will be given of how the potential of the deep field electrode would have to behave in the ideal case during the switching of the transistor:

1. In the switched-on state, the field electrode ought not to be at a highly negative voltage, since otherwise a pinch-off of the epitaxial layer in the mesa structure occurs which brings about an increased on resistance. The field electrode would ideally be at a positive voltage which leads to an accumulation in the mesa structure and thus even additionally lowers the on resistance.

2. In the off state, the field electrode ought to be at a medium potential between rear side and front side, so that the oxides at trench bottom, trench sidewall and between field electrode and gate electrode are loaded as uniformly as possible.

3. During switch-on, the field electrode-drain capacitance must be rapidly charged: the voltage between field electrode and drain rises from a negative value to zero or even a positive value. The charge-reversal current should not load the gate driver.

4. During switch-off, the field electrode-drain capacitance must be rapidly discharged: the voltage between field electrode and drain falls to a negative value. In this case, too, the discharge current of the field electrode-drain capacitance should not load the gate driver.

A body substrate diode may serve to fulfill requirement 2 (see basic circuit diagram, FIG. 26). For this purpose, the body layer of the diode must be electrically connected to the field electrode. The lowered breakdown voltage of the diode thus upwardly limits the voltage between substrate and field electrode. However, a positive voltage cannot then be present at the field electrode (relative to source) in the switched-on state since the body substrate diode would otherwise be forward biased.

A pull-down element is additionally required, which, in the off state case, prevents the potential of the field electrode from slowly drifting up to substrate potential due to the diode leakage current of the body substrate diode. Moreover, an element is required which can take up the large charge-reversal currents of the field electrode during the switching of the trench transistor (which may be realized in particular as a DMOS) and upwardly and downwardly limits the voltage of the field electrode (a voltage limiter). What is essential is that these elements can also be integrated directly into the trench transistor chip and be realized with the structure elements afforded by the pure field plate trench transistor.

In one embodiment, it is possible to integrate both pull-down and voltage limiting in the negative direction directly into the body substrate diode (FIG. 28):

A lateral PMOS transistor extending from the body of the diode along trench sidewall, trench bottom or silicon surface to the body of the DMOS may serve as the pull-down element. For this purpose, the gate of the PMOS transistor must be at source potential. The PMOS transistor is thus connected up as a MOS diode and becomes conductive as the potential of the body of the substrate diode rises. As an alternative, a simple p-type well resistance could also connect the p-type zone of the body substrate diode to body/source of the DMOS.

A vertical NMOS transistor integrated into the trench sidewalls of the body substrate diode may be used as voltage limiting. The gate of the transistor is at gate potential of the DMOS. This means that the transistor concomitantly switches on when the DMOS is switched on, and short-circuits the field electrode potential with the rear side. This prevents the field electrode from being pulled capacitively to negative voltages.

Voltage limiting of the field electrode voltage in the positive direction is not manifested in this embodiment. Here, the coupling capacitances in the DMOS cell need to be designed such that the field electrode voltage does not rise too far when the transistor is turned off (As an alternative, an additional voltage-limiting structure would have to be integrated).

The core of this embodiment consists in realizing the driving of an additional deep field electrode in the trench of the DMOS cell directly on the chip in which the cell array is formed, together with the structure elements made available by the field plate trench process. The use of a body substrate diode with a lowered breakdown voltage for setting the field electrode voltage in the off-state case is an essential aspect of this concept.

There are also various other possibilities for realizing the two elements of pull-down and voltage limiting, and they are described in detail in the accompanying Powerpoint presentation.

1. Possibilities for realizing the pull-down element:
   a. As body resistance in mesa, as gate poly resistance in trench, as FP poly resistance in trench or as planar poly resistance on field oxide.
   b. As PMOS transistor. Variants: trench bottom, trench sidewall, silicon surface.
   c. As NMOS depletion-mode transistor with gate oxide.

2. Possibilities for realizing the voltage limiting element:
   a. as diode or diode chain in silicon
   b. as diode or diode chain in poly
   c. as NMOS transistor in the trench directly in the body substrate diode structure
   d. as FP-source capacitor The function of pull-down and voltage limiter may be undertaken in part or entirely by suitable tuning of the parasitic capacitances contained in the transistor cell. For this purpose, as is illustrated in FIG. 29, a further electrode may be provided in the trench, the further electrode serving for shielding and tuning of the capacitances.

A further variant uses not only the pure body substrate diode, but an arrangement in which the body substrate diode is reverse-connected in series with a further diode (see FIGS. 30 and 31). In this variant, the pull-down element may be connected up to gate instead of to source. In the switched-on state, the additional diode then prevents a current flow from gate to drain.

Detailed description of the realization of the voltage limiting element:
  as diode or diode chain in silicon
    as single diode n-type portion connected to the p-type zone of the body mesa diode and the p-type portion connected to the source (if the field electrode voltage becomes<source voltage, diode opens, and if the field electrode voltage becomes>the breakdown voltage (to be defined>zener diode), the voltage can be upwardly limited)
    can possibly be combined with an NMOS transistor as pull-down (see above)
  as diode or diode chain in poly requires the integration of a polydiode into the technology as NMOS transistor in the trench directly in the body substrate diode structure
  The gate of the transistor would have to be at DMOS gate potential.
  In the off-state case, therefore, the gate oxide of the transistor is loaded with the full field plate voltage.
  A thick oxide transistor is thus necessary.
  The body substrate diode must contain a source with source-bulk short circuit.
  The field plate-substrate capacitance is charged from drain during the switch-on operation.
  Possible problem: bipolar parasitic in the body substrate diode. However: diode is only connected to field plate and, therefore, cannot carry an unlimited current in any case.

as field electrode-source capacitor
  For the capacitive decoupling of field electrodes and gate in the cell array, it may be necessary in any case to introduce an additional central (third) field plate at source potential.
  Given suitable setting of the capacitance ratio between substrate and lower field plate and between lower field plate and central (source) plate, the use of a separate voltage limiting element may be unnecessary.
  Problem: geometrically given capacitance ratio approximately 3:1.

Detailed description of the realization of the pull-down element:
  as body resistance in mesa
  as gate poly resistance in trench or as poly meander on FOX (field electrode oxide)
  as FP poly resistance in trench as PMOS transistor:
    Variants: trench bottom, trench sidewall, silicon surface.
    Problem: bulk control
      Gate must be connected to source. In the switched-off state of the DMOS, the PMOS transistor is turned on to the greatest extent. Transistor can hardly take up the discharge current of the field plate during switch-off. Consequence: field plate control exhibits an overshoot during turn-off
  as NMOS transistor: lateral thick oxide transistor in the trench.
    Gate voltage=field plate voltage.
    Possibly a plurality of transistors in series required: N+ to body breakdown limits FP voltage. If a separately lightly doped extended source implantation exists in the technology, it could be used to achieve a diode with a sufficiently high breakdown voltage.
    Transistor chain may simultaneously serve as a zener diode chain which limits the field electrode voltage in respect of a negative value.
    Advantage: diode chain can accept the discharge current of the field plate in the avalanche mode during switch-off.
    Problem: in the case of overvoltage, a large current flows via this path. Therefore, either the same diode chain must also be used as gate zener ring, or the breakdown voltage of the DMOS must be reliably less than the breakdown voltage of the diode chain.
    Problem: Transistor drifting due to avalanche mode.
    Necessary: shallow contact hole, since N+ must be connected separately from P+.
  as NMOS depletion-mode transistor with gate oxide
    In this case, too: transistor chain required owing to breakdown voltage N+ to body
    Local interconnection of the gate possible, therefore gate oxide
    Likewise required: shallow contact hole.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A field plate trench transistor having a semiconductor body comprising:
   a trench structure;
   an electrode structure embedded in the trench structure, the electrode structure being electrically insulated from the semiconductor body by an insulation structure and having a gate electrode structure and a field electrode structure arranged below and/or alongside the gate electrode structure and electrically insulated from the latter; and
   a voltage divider which is integrated into the field electrode structure or provided within mesa zones of adjoining trenches containing field plates, the voltage divider being configured such that the field electrode structure is set to a potential lying between source and drain potentials and/or gate and drain potentials,
   wherein the voltage divider which is connected between source and drain potentials is realized as a series circuit of voltage divider regions comprising at least one resistor and at least one diode which is forward-biased with respect to the source potential.

2. The field plate trench transistor as claimed in claim 1, wherein the at least one diode is a zener diode.

3. The field plate trench transistor as claimed in claim 1, wherein the field electrode structure is divided into a plurality of field electrode regions arranged vertically one above another and the voltage divider is divided into a plurality of the voltage divider regions, each voltage divider region being electrically connected to a field electrode region or integrated into the latter, so that at least two different field electrode regions are at different potentials.

4. The field plate trench transistor as claimed in claim 3, wherein the different field electrode regions within the trench structure are electrically insulated from one another, and the voltage divider is provided outside the field electrode structure.

5. The field plate trench transistor as claimed in claim 3, wherein the different field electrode regions within the trench structure are electrically connected to one another, and the voltage divider is provided within the field electrode structure.

6. The field plate trench transistor as claimed in claim 5, wherein pn diodes are provided between the field electrode regions, in such a way that the pn diodes are interlinked with one another via the field electrode regions to form a vertically running diode series circuit.

7. The field plate trench transistor as claimed in claim 6, wherein the upper end of the diode series circuit directly adjoins a source metallization layer of the transistor, and the lower end of the diode series circuit directly adjoins a drift zone provided within the semiconductor body.

* * * * *